US007495474B2

(12) United States Patent
Komatsu et al.

(10) Patent No.: US 7,495,474 B2

(45) Date of Patent: Feb. 24, 2009

(54) INTEGRATED CIRCUIT DEVICE AND ELECTRONIC INSTRUMENT

(75) Inventors: Fumikazu Komatsu, Okaya (JP); Shoichiro Kasahara, Minowa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/603,746

(22) Filed: Nov. 22, 2006

(65) Prior Publication Data

US 2007/0120579 A1 May 31, 2007

(30) Foreign Application Priority Data

Nov. 25, 2005 (JP) ............................. 2005-340764
Jul. 7, 2006 (JP) ............................. 2006-187813

(51) Int. Cl.
*H03K 19/094* (2006.01)

(52) U.S. Cl. ........................................... 326/82; 326/86

(58) Field of Classification Search ................... 326/82, 326/83, 86, 87; 327/108, 109
See application file for complete search history.

(56) References Cited

U.S. PATENT DOCUMENTS 6,833,738 B2 * 12/2004 Nakada ....................... 327/58
2005/0134309 A1 * 6/2005 Komatsu et al. .............. 326/47

FOREIGN PATENT DOCUMENTS

JP 2000-049585 2/2000
JP 2001-196916 7/2001

* cited by examiner

*Primary Examiner*—Rexford Barnie
*Assistant Examiner*—Thienvu V Tran
(74) *Attorney, Agent, or Firm*—Harness, Dickey & Pierce, P.L.C.

(57) ABSTRACT

An integrated circuit device includes a first transfer mode first transmitter circuit including first and second transmission drivers and a second transfer mode second transmitter circuit including third and fourth transmission drivers. A transistor PT1 of the first transmission driver and a transistor PT3 of the third transmission driver are formed in a P-type transistor area ARP1, a transistor NT1 of the first transmission driver and a transistor NT3 of the third transmission driver are formed in an N-type transistor area ARN1, a transistor PT2 of the second transmission driver and a transistor PT4 of the fourth transmission driver are formed in a P-type transistor area ARP2, and a transistor NT2 of the second transmission driver and a transistor NT4 of the fourth transmission driver are formed in an N-type transistor area ARN2.

23 Claims, 17 Drawing Sheets

MACROCELL MC1
AR1
ARP1
ARN1
PT1
PT3
NT1
NT3
NTRTP
RSP
ARR1
DP
AVSS
DM
ARR2
AR2
ARP2
ARN2
PT2
PT4
RSM
NT2
NT4
NTRTM
D1
D2
D3
D4

| IN | OUTENB | OP | ON |
| --- | --- | --- | --- |
| L | H | H | H |
| H | H | L | L |
| — | L | H | L |

300
ELECTRONIC INSTRUMENT
USB
(DP, DM)
310
DATA TRANSFER CONTROL DEVICE
(INTEGRATED CIRCUIT DEVICE)
DMA BUS
CPU BUS
320
APPLICATION LAYER DEVICE
PROCESSING SECTION (CPU)
330
ROM
340
RAM
350
DISPLAY SECTION
360
OPERATION SECTION
370

INTEGRATED CIRCUIT DEVICE AND ELECTRONIC INSTRUMENT

Japanese Patent Application No. 2005-340764 filed on Nov. 25, 2005 and Japanese Patent Application No. 2006-187813 filed on Jul. 7, 2006, are hereby incorporated by reference in their entirety.

BACKGROUND OF THE INVENTION

The present invention relates to an integrated circuit device and an electronic instrument.

In the Universal Serial Bus (USB) 2.0 standard, the high speed (HS) transfer mode, the full speed (FS) transfer mode, and the low speed (LS) transfer mode are provided. In the HS mode, the FS mode, and the LS mode, data is transferred at a rate of 480 Mbps, 12 Mbps, and 1.5 Mbps, respectively. As electrical characteristics required for an LS mode transmitter circuit, the USB standard specifies that the rise time and the fall time of an output signal be adjusted within the range of 75 to 300 ns with respect to the load capacitance within the wide range of 50 to 350 pf. The LS mode transmitter circuit is unnecessary for a USB device which supports only the HS and FS modes. On the other hand, the LS mode transmitter circuit must be provided in a USB host or a USB device which supports the LS mode.

As related-art examples which realize the LS mode transmitter circuit, a first related-art example discloses providing a slew rate adjustment capacitance to an output node of a transmitter circuit, and a second related-art example discloses controlling gate control signals for transistors forming a transmitter circuit in a complicated manner in order to conform to the standard (JP-A-2000-49585 and JP-A-2001-196916).

However, the first and second related-art examples do not take data transfer in the USB 2.0 HS mode into consideration. When providing a large slew rate adjustment capacitor to the output node of the transmitter circuit as disclosed in the first related-art example, the circuit scale is increased. Moreover, data transfer in the HS mode becomes difficult. According to the second related-art example, since the control of the gate control signals becomes complicated, the circuit becomes complicated and increased in scale.

SUMMARY

According to one aspect of the invention, there is provided an integrated circuit device comprising:

a first transfer mode first transmitter circuit which transmits data in a first transfer mode through first and second signal lines making up a differential pair, and includes a first transmission driver which drives the first signal line and a second transmission driver which drives the second signal line; and a second transfer mode second transmitter circuit which transmits data through the first and second signal lines making up the differential pair in a second transfer mode which is higher in speed than the first transfer mode, and includes a third transmission driver which drives the first signal line and a fourth transmission driver which drives the second signal line;

a first P-type transistor forming the first transfer mode first transmission driver and a third P-type transistor forming the second transfer mode third transmission driver being formed in a first P-type transistor area;

a first N-type transistor forming the first transfer mode first transmission driver and a third N-type transistor forming the second transfer mode third transmission driver being formed in a first N-type transistor area;

a second P-type transistor forming the first transfer mode second transmission driver and a fourth P-type transistor forming the second transfer mode fourth transmission driver being formed in a second P-type transistor area; and a second N-type transistor forming the first transfer mode second transmission driver and a fourth N-type transistor forming the second transfer mode fourth transmission driver being formed in a second N-type transistor area.

According to another aspect of the invention, there is an electronic instrument comprising:

one of the integrated circuit devices; and a processing section which controls the integrated circuit device.

BRIEF DESCRIPTION OF THE SEVERAL VIEWS OF THE DRAWING

FIG. 5 shows a layout example of LS and FS transmitter circuits and the like.

FIG. 6 shows a detailed layout example of LS and FS transmitter circuits and the like.

FIGS. 8A, 8B, and 8C show signal waveform examples of transmission control signals and the like.

DETAILED DESCRIPTION OF THE EMBODIMENT

Figure 1:
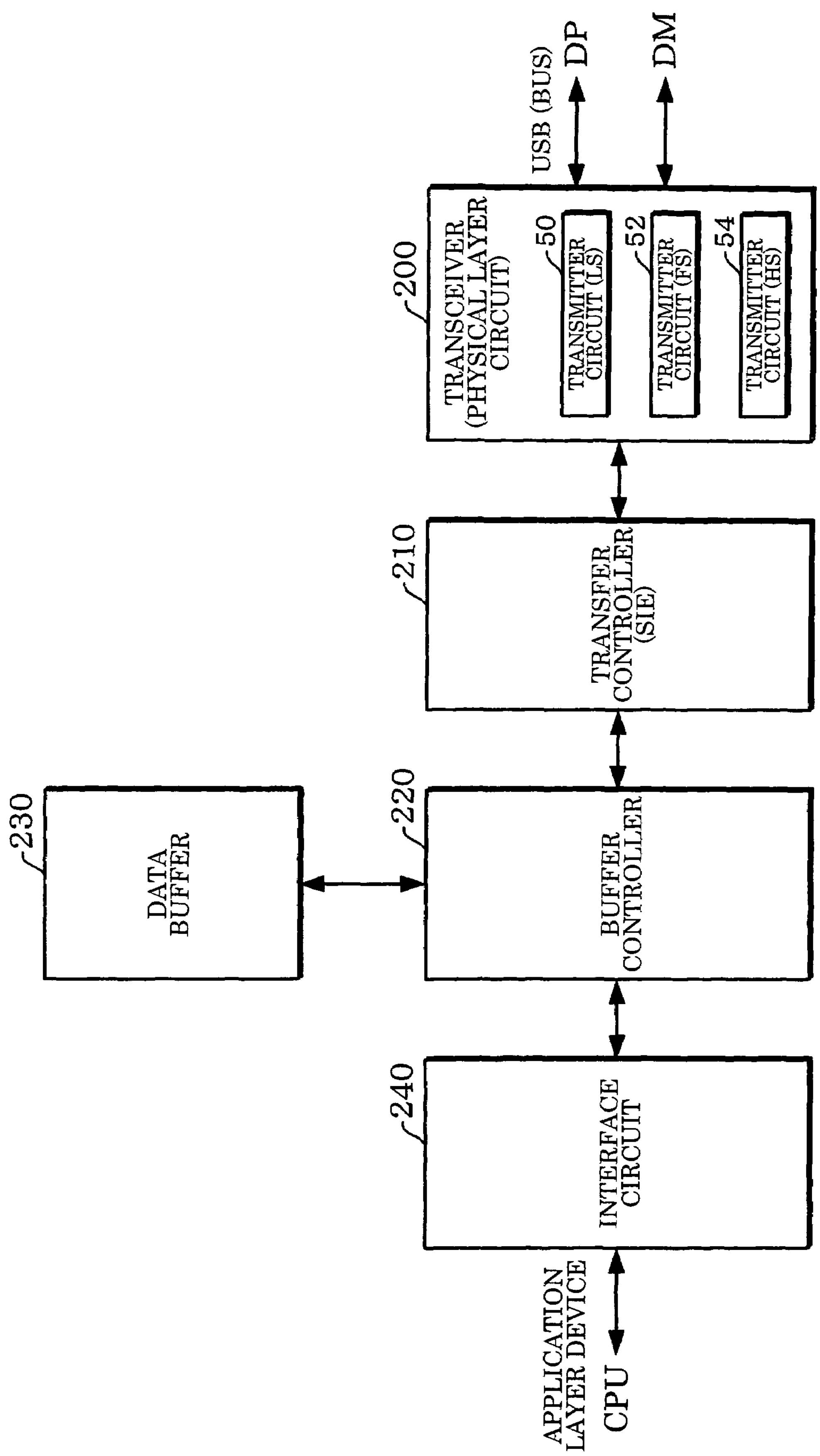
FIG. 1 shows a configuration example of a data transfer control device realized using an integrated circuit device according to one embodiment of the invention.

The invention may provide an integrated circuit device which can transmit data in first and second transfer modes using small-scale circuits, and an electronic instrument including the integrated circuit device.

According to one embodiment of the invention, there is provided an integrated circuit device comprising:

a first transfer mode first transmitter circuit which transmits data in a first transfer mode through first and second signal lines making up a differential pair, and includes a first transmission driver which drives the first signal line and a second transmission driver which drives the second signal line; and a second transfer mode second transmitter circuit which transmits data through the first and second signal lines making up the differential pair in a second transfer mode which is higher in speed than the first transfer mode, and includes a third transmission driver which drives the first signal line and a fourth transmission driver which drives the second signal line;

a first P-type transistor forming the first transfer mode first transmission driver and a third P-type transistor forming the second transfer mode third transmission driver being formed in a first P-type transistor area;

a first N-type transistor forming the first transfer mode first transmission driver and a third N-type transistor forming the second transfer mode third transmission driver being formed in a first N-type transistor area;

a second P-type transistor forming the first transfer mode second transmission driver and a fourth P-type transistor forming the second transfer mode fourth transmission driver being formed in a second P-type transistor area; and a second N-type transistor forming the first transfer mode second transmission driver and a fourth N-type transistor forming the second transfer mode fourth transmission driver being formed in a second N-type transistor area.

According to this embodiment, the P-type transistor forming the first transfer mode transmission driver and the P-type transistor forming the second transfer mode transmission driver are formed in a same transistor area. The N-type transistor forming the first transfer mode transmission driver and the N-type transistor forming the second transfer mode transmission driver are formed in a same transistor area.

Therefore, the first transfer mode transmitter circuit and the second transfer mode transmitter circuit can be realized with a reduced transistor area, whereby the data transmission in the first and second transfer modes can be realized using small-scale circuits.

In the integrated circuit device according to this embodiment, the first P-type transistor forming the first transmission driver may be provided between a first output node, which is an output node of the first transmission driver, and a first power supply, and provided with a first P-side transmission control signal at its gate;

the first N-type transistor forming the first transmission driver may be provided between the first output node and a second power supply, and provided with a first N-side transmission control signal at its gate;

the second P-type transistor forming the second transmission driver may be provided between a second output node, which is an output node of the second transmission driver, and the first power supply, and provided with a second P-side transmission control signal at its gate;

the second N-type transistor forming the second transmission driver may be provided between the second output node and the second power supply, and provided with a second N-side transmission control signal at its gate;

the third P-type transistor forming the third transmission driver may be provided between a third output node, which is an output node of the third transmission driver, and the first power supply, and provided with a third P-side transmission control signal at its gate;

the third N-type transistor forming the third transmission driver may be provided between the third output node and the second power supply, and provided with a third N-side transmission control signal at its gate;

the fourth P-type transistor forming the fourth transmission driver may be provided between a fourth output node, which is an output node of the fourth transmission driver, and the first power supply, and provided with a fourth P-side transmission control signal at its gate; and the fourth N-type transistor forming the fourth transmission driver may be provided between the fourth output node and the second power supply, and provided with a fourth N-side transmission control signal at its gate.

This allows the first transfer mode transmitter circuit and the second transfer mode transmitter circuit to be realized using circuits with a simple configuration.

The integrated circuit device according to this embodiment may comprise:

a first transfer mode first transmission control circuit which generates and outputs the first P-side and N-side transmission control signals and the second P-side and N-side transmission control signals; and a second transfer mode second transmission control circuit which generates and outputs the third P-side and N-side transmission control signals and the fourth P-side and N-side transmission control signals.

This allows the rise time and the fall time of the output signals of the first and second transmitter circuits to be adjusted by merely adjusting the rise time and the fall time of the transmission control signals, for example.

In the integrated circuit device according to this embodiment, the first transmission control circuit may generate and output the first P-side and N-side transmission control signals and the second P-side and N-side transmission control signals of which rise time or fall time is greater than rise time or fall time of the third P-side and N-side transmission control signals and the fourth P-side and N-side transmission control signals output from the second transmission control circuit.

This allows the rise time and the fall time of the first transfer mode transmitter circuit to be increased using a simple circuit and control, whereby it becomes possible to easily conform to the standard.

In the integrated circuit device according to this embodiment, the first P-type transistor area and the first N-type transistor area may be adjacently formed; and the second P-type transistor area and the second N-type transistor area may be adjacently formed.

This further reduces the circuit area required for the first transfer mode transmitter circuit and the second transfer mode transmitter circuit.

The integrated circuit device according to this embodiment may comprise:

a first damping resistor provided between a first node connected with output nodes of the first and third transmission drivers and the first signal line; and a second damping resistor provided between a second node connected with output nodes of the second and fourth transmission drivers and the second signal line;

wherein the first damping resistor may be formed in a first resistor area adjacent to the first N-type transistor area; and wherein the second damping resistor may be formed in a second resistor area adjacent to the second N-type transistor area.

This allows the first and second damping resistors to be provided in the integrated circuit device, and minimizes an increase in the circuit scale due to the provision of the first and second damping resistors.

In the integrated circuit device according to this embodiment, the first and second damping resistors may be formed using an N-type diffusion layer.

This further reduces an increase in the circuit scale.

The integrated circuit device according to this embodiment may comprise:

a first terminating resistor circuit provided between a first node connected with output nodes of the first and third transmission drivers and a second power supply; and a second terminating resistor circuit provided between a second node connected with output nodes of the second and fourth transmission drivers and the second power supply;

wherein an N-type transistor forming the first terminating resistor circuit may be formed in the first N-type transistor area; and wherein an N-type transistor forming the second terminating resistor circuit may be formed in the second N-type transistor area.

This minimizes an increase in the circuit due to provision of the first and second terminating resistor circuits.

The integrated circuit device according to this embodiment may comprise:

a terminating resistor control circuit which variably controls terminating resistances of the first and second terminating resistor circuits.

This enables the amplitude of the output signal (output high level voltage) to be adjusted by controlling the terminating resistance.

The integrated circuit device according to this embodiment may comprise:

a third transfer mode third transmitter circuit which transmits data through the first and second signal lines making up the differential pair in a third transfer mode higher in speed than the second transfer mode;

wherein the third transmitter circuit may include:

a constant current circuit provided between a first power supply and a given node;

a first switch element provided between the node and the first signal line; and a second switch element provided between the node and the second signal line.

According to this embodiment, the first transfer mode transmitter circuit can be realized while increasing the capacitance added to the output node of the first transmitter circuit to only a small extent. Therefore, a high-speed third transfer mode data transfer using the current-driven third transmitter circuit can be effectively prevented from being adversely affected.

In the integrated circuit device according to this embodiment, the third transmitter circuit may include a current control circuit which variably controls a value of current flowing from the constant current circuit, and drives the first or second signal line through the first or second switch element using current from the constant current circuit variably controlled by the current control circuit.

According to this embodiment, the value of current (constant current) from the constant current circuit is not fixed, but variably controlled using the current control circuit. For example, the first or second signal line is driven (current-driven) using current with a first current value from the constant current circuit when a first setting is performed by the current control circuit, and the first or second signal line is driven using current with a second current value from the constant current circuit when a second setting is performed by the current control circuit. This enables adjustment of the amplitude of the output signal (e.g. output high level voltage), whereby intelligent control can be achieved such as maintaining an excellent signal waveform or reducing power consumption.

The integrated circuit device according to this embodiment may comprise:

a first buffer circuit which outputs a first transmission control signal to a gate of a first transistor forming the first switch element; and a second buffer circuit which outputs a second transmission control signal to a gate of a second transistor forming the second switch element;

wherein one of the first and second transmission control signals may be set to inactive when the other is set to active; and wherein each of the first and second buffer circuits may include:

a first inverter;

a second inverter of which an input node is connected with an output node of the first inverter; and a capacitance adjustment circuit connected with the output node of the first inverter.

This allows adjustment of the slew rate of the output signal, for example.

In the integrated circuit device according to this embodiment, differential signals transmitted through the first and second signal lines making up the differential pair may be signals according to the Universal Serial Bus (USB) standard; and the first, second, and third transfer modes may be respectively the low speed mode, the full speed mode, and the high speed mode of the USB standard.

According to another embodiment of the invention, there is provided an electronic instrument comprising:

one of the integrated circuit devices; and a processing section which controls the integrated circuit device.

Preferred embodiments of the invention are described below in detail. Note that the embodiments described below do not in any way limit the scope of the invention defined by the claims laid out herein. Note that all elements of the embodiments described below should not necessarily be taken as essential requirements for the invention.

1. Circuit Configuration of Integrated Circuit Device

FIG. 1 shows a circuit configuration example of a data transfer control device realized using an integrated circuit device according to this embodiment. Note that the configuration of the device realized using the integrated circuit device according to this embodiment is not limited to the configuration shown in FIG. 1. For example, a data transfer control device with a configuration differing from the configuration shown in FIG. 1 may be realized. Or, a configuration such as an application layer device or a CPU (processor in a broad sense) may be added to the configuration shown in FIG. 1 to form a one-chip integrated circuit device.

The data transfer control device shown in FIG. 1 includes a transceiver 200, a transfer controller 210, a buffer controller 220, a data buffer 230, and an interface circuit 240. Note that some of these circuit blocks may be omitted, or the connection configuration of these circuit blocks may be changed, or another circuit block may be added. For example, a configuration may also be employed in which the buffer controller 220, the data buffer 230, or the interface circuit 240 is omitted.

The transceiver 200 (physical layer circuit) is a circuit for transmitting and receiving data using DP and DM signal lines (first and second signal lines in a broad sense) making up a differential pair (differential signal lines). The transceiver 200 includes an LS mode (first transfer mode in a broad sense) transmitter circuit 50 and an FS mode (second transfer mode in a broad sense) transmitter circuit 52. The transceiver 200 may include an HS mode (third transfer mode in a broad sense) transmitter circuit 54. The transceiver 200 may also include a receiver circuit (differential receiver and single-ended receiver), a resistor circuit (pull-up resistor circuit and pull-down resistor circuit), a detection circuit (disconnection detection circuit and squelch circuit), a clock signal generation circuit (PLL), a sampling clock signal generation circuit (HSDLL), a reference voltage generation circuit, a parallel/serial conversion circuit, a serial/parallel conversion circuit (elasticity buffer), and the like.

The transfer controller 210 is a controller for controlling data transfer through a USB bus and realizing a function of a serial interface engine (SIE) or the like. For example, the transfer controller 210 performs packet handling, suspend & resume control, transaction management, and the like. The transfer controller 210 may include a link controller and a transaction controller (not shown).

The buffer controller 220 allocates a memory region (e.g. endpoint region and pipe region) in the data buffer 230, or controls access to the memory region of the data buffer 230. In more detail, the buffer controller 220 controls access from the application layer device through the interface circuit 240, access from the CPU through the interface circuit 240, or access from the USB (transfer controller 210), arbitrates these accesses, or generates and manages access addresses.

The data buffer 230 (packet buffer) is a buffer (FIFO) for temporarily storing (buffering) data (transmission data or reception data) transferred through the USB bus. The data buffer 230 may be formed of a memory such as a RAM.

The interface circuit 240 is a circuit for realizing an interface through a direct memory access (DMA) bus to which the application layer device is connected or a CPU bus to which the CPU is connected. The interface circuit 240 may include a DMA handler circuit for DMA transfer, for example.

2. Transmitter Circuit

Figure 2:
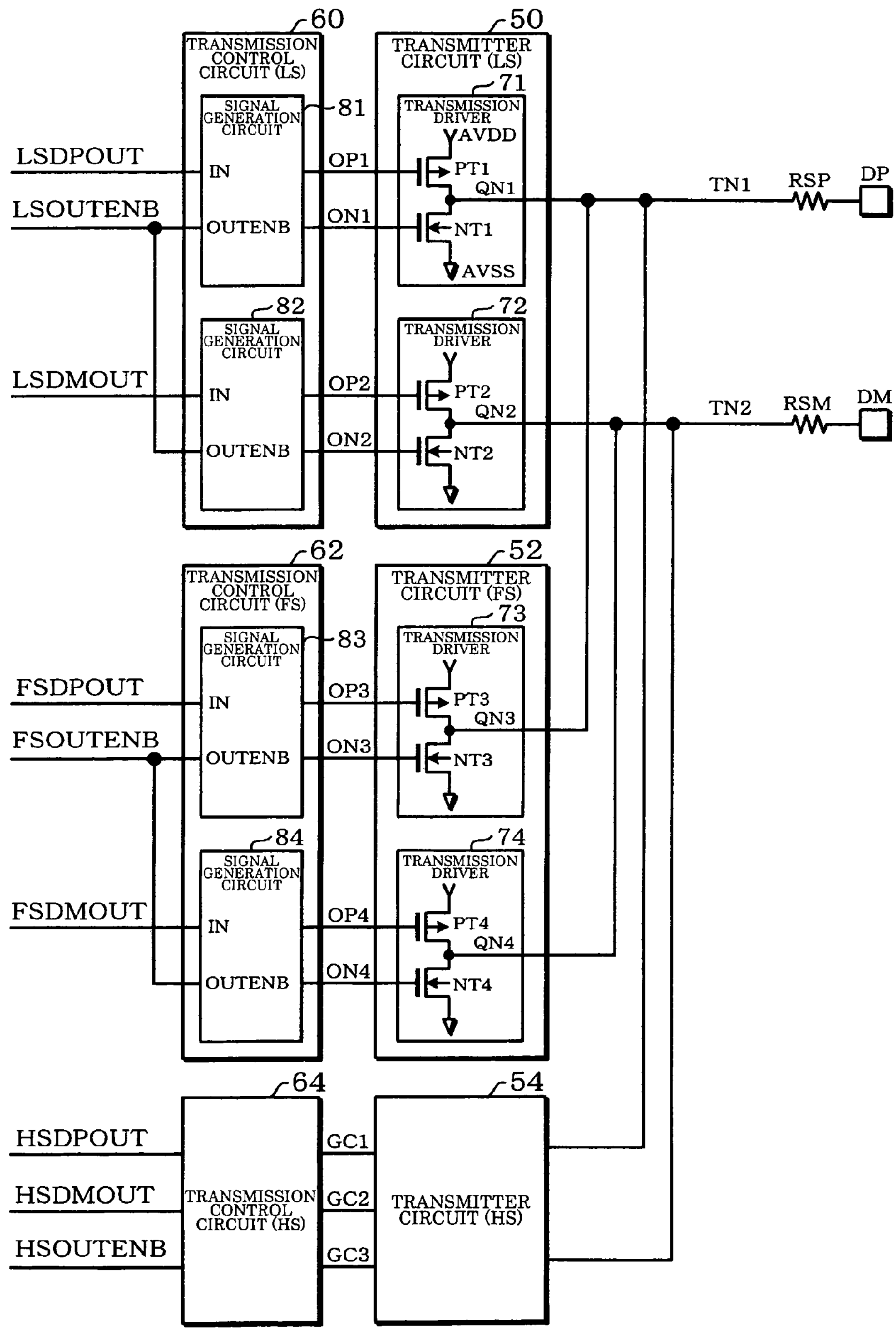
FIG. 2 shows a configuration example of a transmitter circuit and a transmission control circuit.

FIG. 2 shows a configuration example of the transmitter circuits and transmission control circuits included in the integrated circuit device according to this embodiment. In FIG. 2, the LS mode (first transfer mode) first transmitter circuit 50 is a circuit which transmit data in the low speed (LS) mode through the DP and DM signal lines (first and second signal lines) making up a differential pair (differential data signal lines). The transmitter circuit 50 includes a first transmission driver 71 which drives (voltage-drives) the DP signal line (first signal line) and a second transmission driver 72 which drives the DM signal line (second signal line).

The FS mode (second transfer mode) second transmitter circuit 52 is a circuit which transmits data through the DP and DM signal lines in the full speed (FS) mode higher in speed than the LS mode. The transmitter circuit 52 includes a third transmission driver 73 which drives the DP signal line and a fourth transmission driver 74 which drives the DM signal line.

The HS mode (second transfer mode in a broad sense) third transmitter circuit 54 is a circuit which transmits data through the DP and DM signal lines in the high speed (HS) mode higher in speed than the FS mode. The transmitter circuit 54 includes a constant current circuit provided between a power supply AVDD (first power supply in a broad sense) and a given node, a first switch element provided between the above node and the DP signal line, and a second switch element provided between the above node and the DM signal line.

A first P-type transistor PT1 forming the LS DP-side transmission driver 71 is provided between a first output node QN1 (output node of the transmission driver 71) and the power supply AVDD. A first P-side transmission control signal OP1 is input to the gate of the first P-type transistor PT. A first N-type transistor NT1 forming the transmission driver 71 is provided between the output node QN1 and a power supply AVSS (second power supply in a broad sense). A first N-side transmission control signal ON1 is input to the gate of the first N-type transistor NT1.

A second P-type transistor PT2 forming the LS DM-side transmission driver 72 is provided between a second output node QN2 (output node of the transmission driver 72) and the power supply AVDD. A second P-side transmission control signal OP2 is input to the gate of the second P-type transistor PT2. A second N-type transistor NT2 forming the transmission driver 72 is provided between the output node QN2 and the power supply AVSS. A second N-side transmission control signal ON2 is input to the gate of the second N-type transistor NT2.

A third P-type transistor PT3 forming the FS DP-side transmission driver 73 is provided between a third output node QN3 (output node of the transmission driver 73) and the power supply AVDD. A third P-side transmission control signal OP3 is input to the gate of the third P-type transistor PT3. A third N-type transistor NT3 forming the transmission driver 73 is provided between the output node QN3 and the power supply AVSS. A third N-side transmission control signal ON3 is input to the gate of the third N-type transistor NT3.

A fourth P-type transistor PT4 forming the FS DM-side transmission driver 74 is provided between a fourth output node QN4 (output node of the transmission driver 74) and the power supply AVDD. A fourth P-side transmission control signal OP4 is input to the gate of the fourth P-type transistor PT4. A fourth N-type transistor NT4 forming the transmission driver 74 is provided between the output node QN4 and the power supply AVSS. A fourth N-side transmission control signal ON4 is input to the gate of the fourth N-type transistor NT4.

The configuration of the transmission drivers 71, 72, 73, and 74 is not limited to the configuration shown in FIG. 2. The connection relationship of the transmission drivers 71, 72, 73, and 74 may be changed, or another transistor may be added.

An LS first transmission control circuit 60 receives LS data signals LSDPOUT and LSDMOUT and an enable signal LSOUTENB, and generates and outputs the first P-side and N-side transmission control signals OP1 and ON1 and the second P-side and N-side transmission control signals OP2 and ON2. The transmission control circuit 60 includes a first signal generation circuit 81 which generates the signals OP1 and ON1 and a second signal generation circuit 82 which generates the signals OP2 and ON2.

An FS second transmission control circuit 62 receives FS data signals FSDPOUT and FSDMOUT and an enable signal FSOUTENB, and generates and outputs the third P-side and N-side transmission control signals OP3 and ON3 and the fourth P-side and N-side transmission control signals OP4 and ON4. The transmission control circuit 62 includes a third signal generation circuit 83 which generates the signals OP3 and ON3 and a fourth signal generation circuit 84 which generates the signals OP4 and ON4.

An HS transmission control circuit 64 receives HS data signals HSDPUOT and HSDMOUT and an enable signal HSOUTENB, and generates and outputs first to third transmission control signals GC1, GC2, and GC3.

The LS transmission control circuit 60 outputs the transmission control signals OP1, ON1, OP2, and ON2 of which the rise time or the fall time is longer than the rise time or the fall time of the transmission control signals OP3, ON3, OP4, and ON4 output from the FS transmission control circuit 62. In other words, the LS transmission control circuit 60 outputs a transmission control signal having a low slew rate. The term "rise time" used herein may be defined as the period from the time at which the signal level has reached 10% of the peak value to the time at which the signal level has reached 90% of the peak value. The term "fall time" used herein may be defined as the period from the time at which the signal level has reached 90% of the peak value to the time at which the signal level has reached 10% of the peak value.

As shown in FIG. 2, the integrated circuit device according to this embodiment may include a first damping resistor RSP (fixed resistor) provided between a first node TN1 connected with the output nodes QN1 and QN3 of the transmission drivers 71 and 73 and the DP signal line. The integrated circuit device may also include a second damping resistor RSM (fixed resistor) provided between a second node TN2 connected with the output nodes QN2 and QN4 of the transmission drivers 72 and 74 and the DM signal line.

Figure 3:
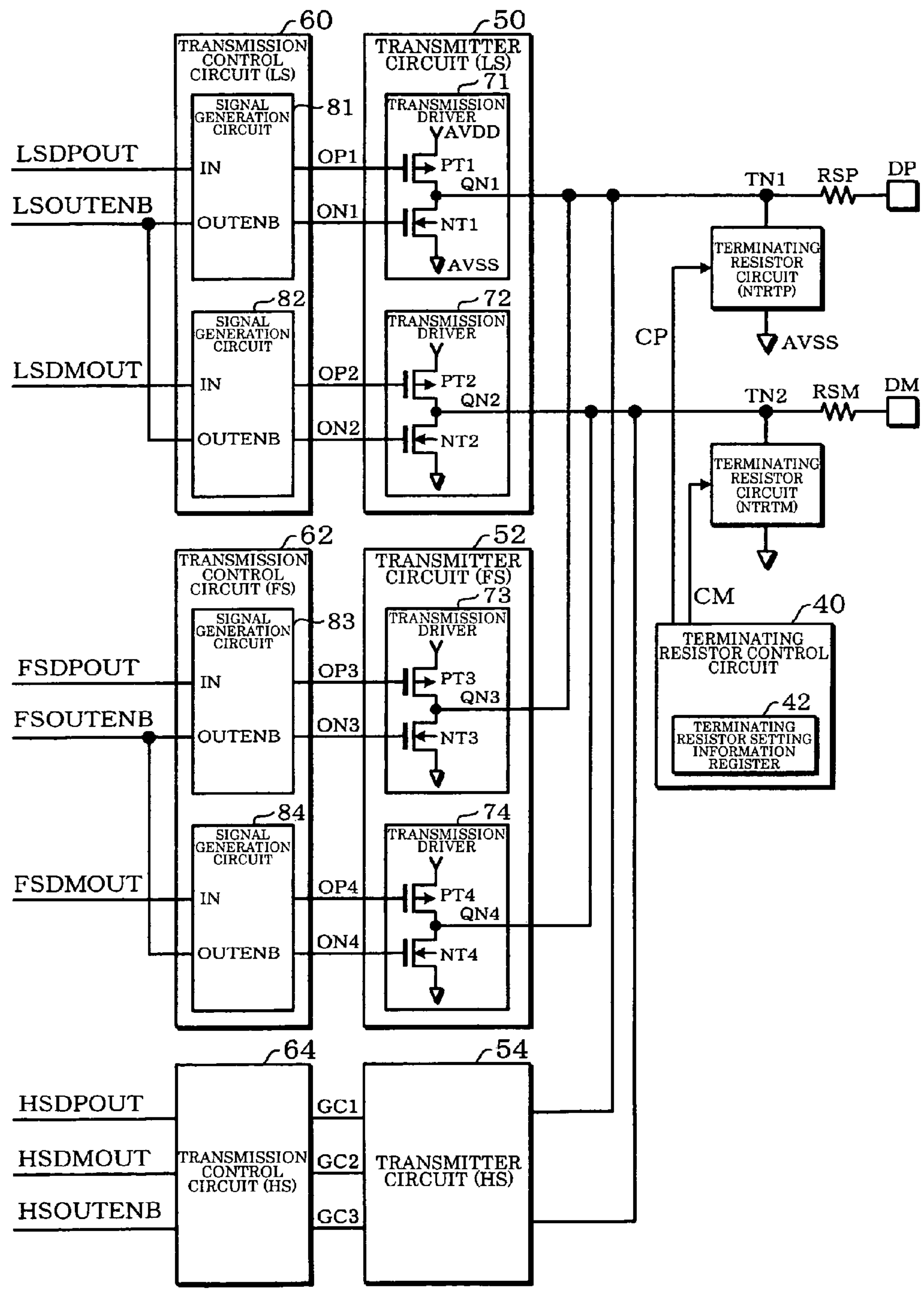
FIG. 3 shows another configuration example of a transmitter circuit and a transmission control circuit.

As shown in FIG. 3, the integrated circuit device according to this embodiment may further include a first terminating resistor circuit 30 provided between the node TN1 and the power supply AVSS, and a second terminating resistor circuit 32 provided between the node TN2 and the power supply AVSS. The terminating resistor circuits 30 and 32 are circuits for terminating the DP and DM signal lines during HS data transfer. The terminating resistances of the terminating resistor circuits 30 and 32 are variably controlled, for example.

As shown in FIG. 3, the integrated circuit device may include a terminating resistor control circuit 40. The terminating resistor control circuit 40 is a circuit for variably controlling (setting) the terminating resistances of the terminating resistor circuits 30 and 32, and includes a terminating resistor setting information register 42. In more detail, the terminating resistor control circuit 40 outputs resistor control signals CP (CP1 to CP3) and CM (CM1 to CM3) to the terminating resistor circuits 30 and 32. The voltage levels of the resistor control signals CP and CM are set based on setting information (setting value) set in the terminating resistor setting information register 42. The setting information may be written into the terminating resistor setting information register 42 by firmware (processing section or CPU), for example.

In FIG. 3, the resistors RSP and RSM are used as LS and FS damping resistors in the LS and FS modes by turning OFF transistors forming resistors of the terminating resistor circuits 30 and 32, for example. In the HS mode, a resistor formed of the resistor RSP and the terminating resistor circuit 30 and a resistor formed of the resistor RSM and the terminating resistor circuit 32 can be utilized as an HS terminating resistor by disabling the LS and FS transmitter circuits 50 and 52. This allows the resistors RSP and RSM to be utilized in common in the LS and FS modes and the HS mode, whereby the circuit scale can be reduced.

3. Layout of Integrated Circuit Device

Figure 4:
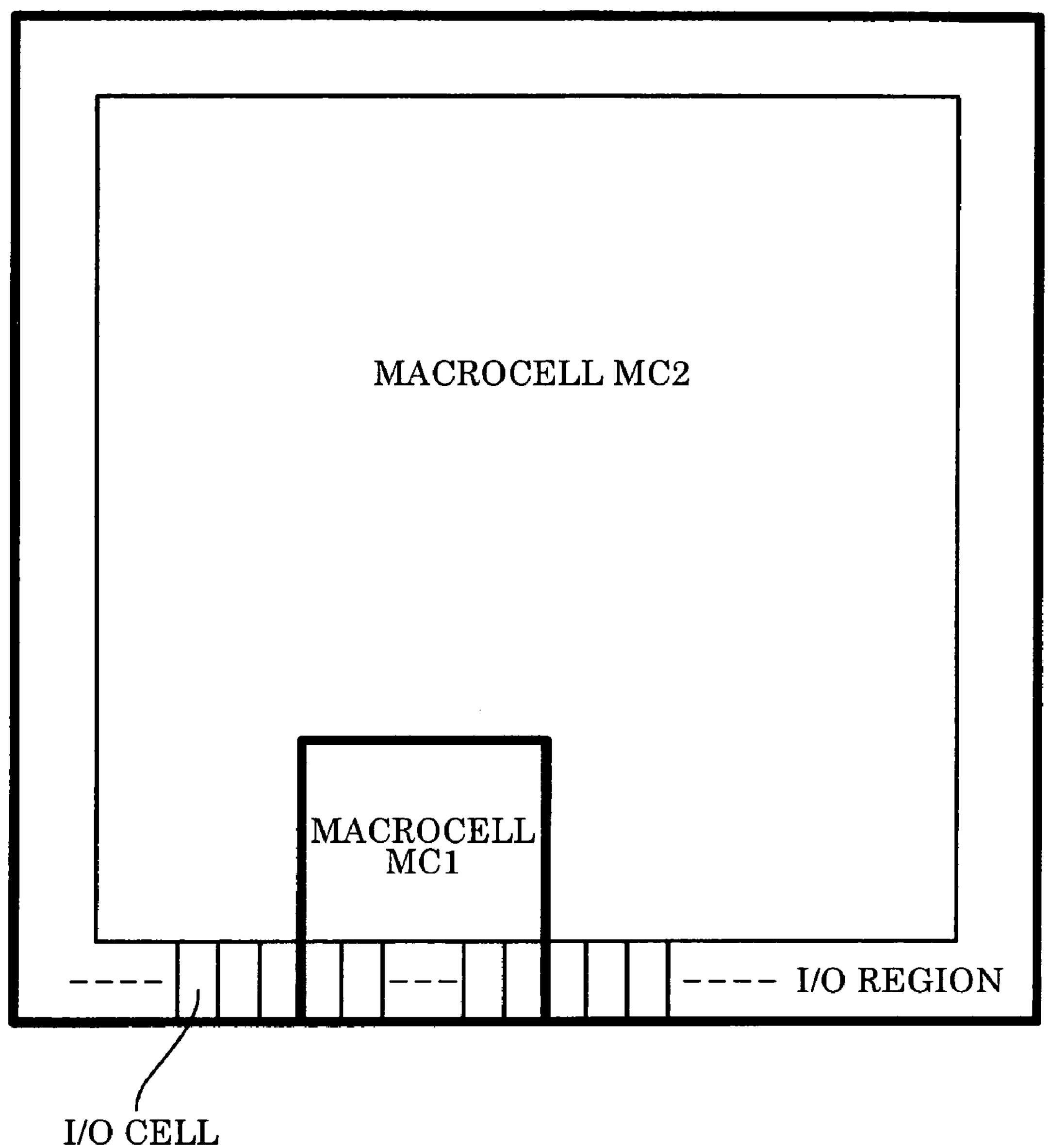
FIG. 4 shows a layout example of an integrated circuit device.

FIG. 4 shows a layout example of the integrated circuit device according to this embodiment. The integrated circuit device includes a first macrocell MC1 and a second macrocell MC2. The macrocells MC1 and MC2 (megacell or macroblock) are units of medium-scale or large-scale circuits having a logic function. The integrated circuit device according to this embodiment may include three or more macrocells.

In FIG. 4, the macrocell MC1 is a macrocell including a physical layer circuit which is the transceiver 200 shown in FIG. 1, for example. The macrocell MC1 may include a circuit (e.g. logical layer circuit) other than the physical layer circuit.

The macrocell MC1 is a hard macro of which the routing and the circuit cell placement are fixed, for example. In more detail, the routing and the circuit cell placement of the macrocell MC1 are achieved by a manual layout. Note that the routing and the placement may be partially automated.

The macrocell MC2 is a macrocell which includes a circuit in a layer (e.g. logical layer, link layer, transaction layer, or application layer) upper than the physical layer. Taking the USB standard as an example, the macrocell MC2 may include a logical layer circuit (logical layer circuit other than the logical layer circuit included in the macrocell MC1) such as a serial interface engine (SIE) and a user logic (circuit specific to device). In FIG. 4, pads (e.g. DP and DM) may be provided inside or outside the I/O region.

The macrocell MC2 is a soft macro of which the routing and the circuit cell placement are automated, for example. In more detail, the routing between basic cells and the like are automatically performed using a gate array automatic placement and routing tool, for example. Note that the routing and placement may be partially fixed.

Figure 5:
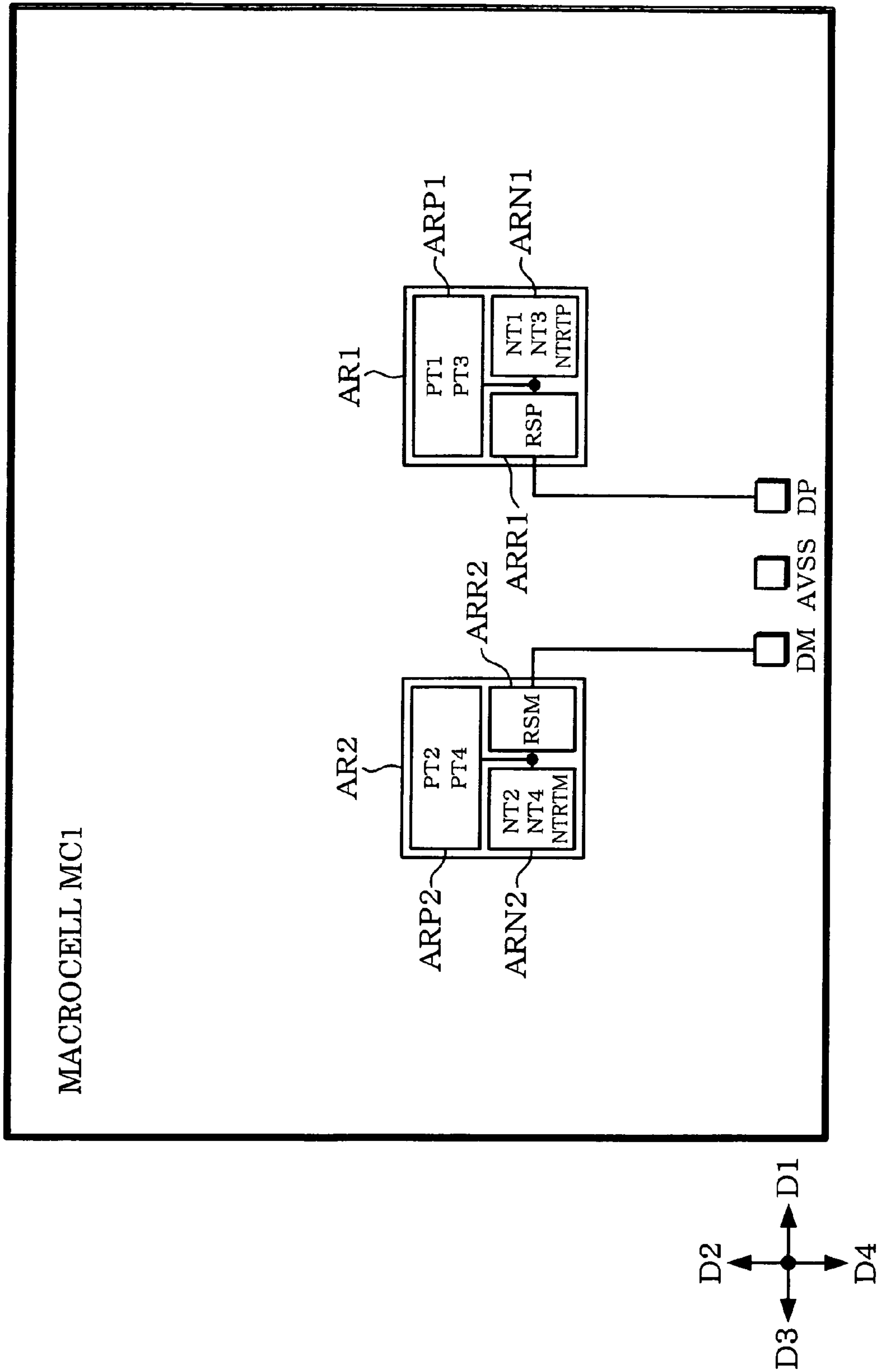

FIG. 5 shows a layout example of the circuits included in the macrocell MC1 such as the transmitter circuits 50 and 52 shown in FIGS. 2 and 3. In FIG. 5, the DP-side circuits are disposed in a first area AR1, and the DM-side circuits are disposed in a second area AR2. The areas AR1 and AR2 are disposed symmetrically with respect to a line extending along a direction D2 in FIG. 5 (direction from the outside toward the inside of the integrated circuit device) as the symmetry axis, for example.

The DP-side area AR1 includes a first P-type transistor area ARP1 and a first N-type transistor area ARN1. The DP-side area AR1 also includes a first resistor area ARR1. The areas ARP1 and ARN1 are adjacently formed, and the areas ARN1 and ARR1 are also adjacently formed.

The DM-side area AR2 includes a second P-type transistor area ARP2 and a second N-type transistor area ARN2. The DM-side area AR2 also includes a second resistor area ARR2. The areas ARP2 and ARN2 are adjacently formed, and the areas ARN2 and ARR2 are also adjacently formed.

In this embodiment, the P-type transistor PT1 forming the LS DP-side transmission driver 71 and the P-type transistor PT3 forming the FS DP-side transmission driver 73 shown in FIGS. 2 and 3 are formed in the P-type transistor area ARP1, as shown in FIG. 5. The N-type transistor NT1 forming the LS DP-side transmission driver 71 and the N-type transistor NT3 forming the FS DP-side transmission driver 73 are formed in the N-type transistor area ARN 1.

The P-type transistor PT2 forming the LS DM-side transmission driver 72 and the P-type transistor PT4 forming the FS DM-side transmission driver 74 are formed in the P-type transistor area ARP2. The N-type transistor NT2 forming the LS DM-side transmission driver 72 and the N-type transistor NT4 forming the FS DM-side transmission driver 74 are formed in the N-type transistor area ARN2.

In this embodiment, the P-type transistor forming the LS transmission driver and the P-type transistor forming the FS transmission driver are collectively formed in a single P-type transistor area. The N-type transistor forming the LS transmission driver and the N-type transistor forming the FS transmission driver are collectively formed in a single N-type transistor area.

In FIG. 5, the damping resistor RSP shown in FIGS. 2 and 3 is formed in the resistor area ARR1 adjacent to the N-type transistor area ARN1. The damping resistor RSM is formed in the resistor area ARR2 adjacent to the N-type transistor area ARN2. The damping resistors RSP and RSM may be formed using an N-type diffusion layer (N+diffusion layer or active region), for example.

In FIG. 5, the N-type transistor NTRTP forming the DP-side terminating resistor circuit 30 shown in FIG. 3 is formed in the DP-side N-type transistor area ARN1. The N-type transistor NTRTM forming the DM-side terminating resistor circuit 32 is formed in the DM-side N-type transistor area ARN2.

Figure 6:
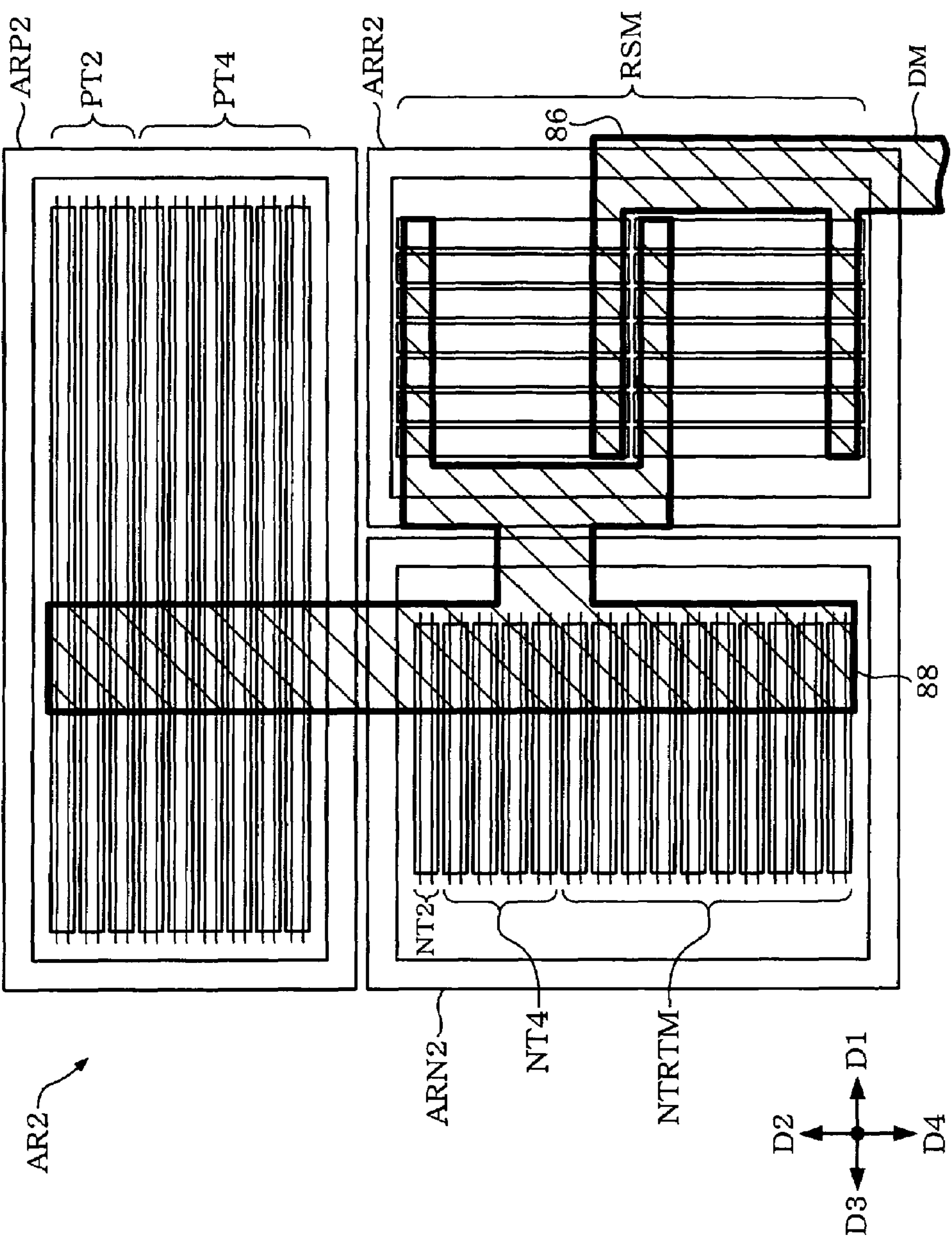

FIG. 6 shows a detailed layout example of the area AR2. The layout of the area AR1 is similar to that shown in FIG. 6. As shown in FIG. 6, the P-type transistor PT2 of the LS transmission driver 72 and the P-type transistor PT4 of the FS transmission driver 74 are adjacently disposed in the P-type transistor area ARP2 along the direction D2. The N-type transistor NT2 of the LS transmission driver 72 and the N-type transistor NT4 of the FS transmission driver 74 are adjacently disposed in the N-type transistor area ARN2 along the direction D2. The N-type transistors NT2 and NT4 and the N-type transistor NTRTM forming the terminating resistor circuit 32 shown in FIG. 3 are adjacently disposed along the direction D2. The damping resistor RSM formed using an N-type diffusion region (N+ diffusion region) is formed in the resistor area ARR2.

A signal line 86 from the DM pad is connected with one end of the damping resistor RSM in the resistor area ARR2. A signal line 88 connected with the other end of the damping resistor RSM is connected with the drains of the transistors PT2, PT4, NT2, and NT4.

In the USB 2.0 standard, the extremely high-speed HS transmitter circuit 54 is provided, as shown in FIGS. 2 and 3. The transmitter circuit 54 current-drives the DP and DM signal lines. Therefore, when a transmitter circuit with a configuration in which a large capacitor is added to the output node of the transmitter circuit (related-art example 1) is employed as the LS transmitter circuit, it is necessary to charge and discharge the large capacitor in the HS mode, whereby it becomes difficult to achieve HS high-speed data transfer. The related-art examples 1 and 2 also have a problem in which the circuit scale of the LS transmitter circuit is increased or the control becomes complicated.

In the LS transmitter circuit 50 according to this embodiment shown in FIGS. 2 and 3, a large capacitor is not added to the nodes TN1 and TN2. Therefore, the HS transfer using the HS transmitter circuit 54 can be prevented from being adversely affected. Moreover, since the LS transmitter circuit 50 can be realized using a configuration similar to that of the FS transmitter circuit 52, the circuit scale of the LS transmitter circuit 50 can be significantly reduced in comparison with the related-art examples 1 and 2. This allows the LS transmitter circuit 50 to be disposed in a free space in the macrocell MC1, whereby the layout area of the integrated circuit device can be reduced. In this embodiment, the transistors forming the LS transmitter circuit 50 and the transistors forming the FS transmitter circuit 52 are collectively formed in the areas AR1 and AR2, as shown in FIG. 5. Therefore, an increase in the circuit area due to the provision of the LS transmitter circuit 50 can be minimized.

For example, the LS transmitter circuit 50 need not be provided in a data transfer control device for a USB device which supports only the HS and FS modes and does not support the LS mode. On the other hand, when providing the macrocell MC1 with the USB host function, an LS USB device such as a mouse may be connected with the DP and DM signal lines. Therefore, it is necessary to additionally provide the LS transmitter circuit 50 in the macrocell MC1 which can implement the USB host function.

In this case, when a large capacitor is added to the output node of the LS transmitter circuit 50 which is additionally provided to implement the USB host function, the HS data transfer cannot be achieved. According to this embodiment, the above problem can be prevented since such a large capacitor is not added.

When the LS transmitter circuit 50 additionally provided has a large circuit scale, the circuit scale of the integrated circuit device is increased. According to this embodiment, the LS transmitter circuit 50 can be realized by merely providing the small transistors PT1, NT1, PT2, and NT2 in the areas ARP1, ARN1, ARP2, and ARN2, respectively, as shown in FIGS. 5 and 6. Therefore, the LS transmitter circuit 50 can be realized without increasing the circuit scale of the integrated circuit device to a large extent, whereby the USB host function using the macrocell MC1 can be easily realized.

In FIGS. 5 and 6, the damping resistors RSP and RSM are provided in the integrated circuit device. Note that a modification is also possible in which the damping resistors RSP and RSM are omitted from the integrated circuit device. In this case, the damping resistors RSP and RSM may be provided using external parts.

In FIGS. 3, 5, and 6, the terminating resistor circuits 30 and 32 and the terminating resistor control circuit 40 are provided in the integrated circuit device. Note that a configuration may also be employed in which these circuits are omitted. In this case, the FS transmitter circuit 52 may drive the DP and DM signal lines at "0" in the HS mode, and the damping resistors RSP and RSM are allowed to function as the terminating resistors.

In FIGS. 5 and 6, the P-type transistor area ARP1 is adjacent to the N-type transistor area ARN1, and the P-type transistor area ARP2 is adjacent to the N-type transistor area ARN2. Note that a modification is also possible in which these areas are not adjacent. For example, the resistor area ARR1 may be formed between the P-type transistor area ARP1 and the N-type transistor area ARN1, or the resistor area ARR2 may be formed between the P-type transistor area ARP2 and the N-type transistor area ARN2.

4. Transmission Control Circuit

Figures 7A, 7B:
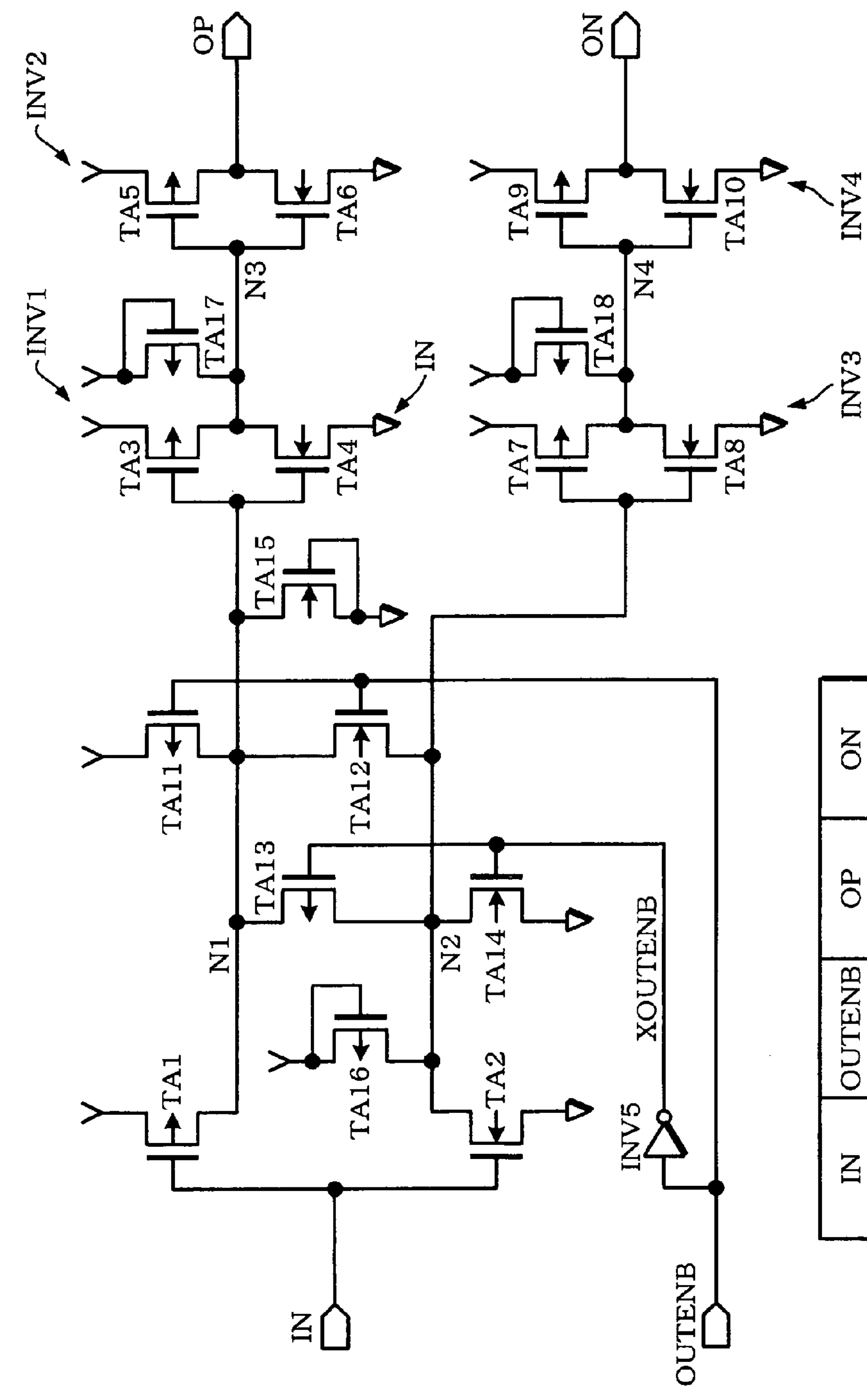
FIGS. 7A and 7B show a configuration example of a signal generation circuit of a transmission control circuit and a truth table.

FIG. 7A shows a detailed configuration example of the signal generation circuits 81, 82, 83, and 84 included in the transmission control circuits 60 and 62.

A signal IN (LSDPOUT, LSDMOUT, FSDPOUT, FSDMOUT) is input to the gates of transistors TA1 and TA2. A node N1 of the drain of the transistor TA1 is connected with the input of an inverter INV1 formed of transistors TA3 and TA4, and an output node N3 of the inverter INV1 is connected with the input of an inverter INV2 formed of transistors TA5 and TA6. A node N2 of the drain of the transistor TA2 is connected with the input of an inverter INV3 formed of transistors TA7 and TA8, and an output node N4 of the inverter INV3 is connected with the input of an inverter INV4 formed of transistors TA9 and TA10.

An enable signal OUTENB (LSOUTENB, FSOUTENB) is input to the gates of transistors TA11 and TA12, and the node NI is connected with the drains of the transistors TA11 and TA12. An inversion signal XOUTENB of the enable signal OUTENB is input to the gates of transistors TA13 and TA14, and the node N2 is connected with the drains of the transistors TA13 and TA14. A transistor TA15 functions as a pull-down resistor, and transistors TA16, TA17, and TA18 function as pull-up resistors.

FIG. 7B shows a truth table of the signal generation circuit shown in FIG. 7A. When the signal OUTENB is set at the H (high) level, the transistors TA12 and TA13 are turned ON, whereby the nodes N1 and N2 are connected through the transistors TA12 and TA13. When the signal IN is set at the L (low) level, the transistor TA1 is turned ON, whereby the nodes N1 and N2 are set at the H level. Therefore, the transmission control signals OP and ON output from the inverters INV2 and INV4 are set at the H level. When the signals OP and ON are set at the H level, the output from the transmission driver to which the signals OP and ON are input is set at the L level, as shown in FIG. 2.

When the signal IN is set at the H level, the transistor TA2 is turned ON, whereby the nodes N1 and N2 are set at the L level. Therefore, the signals OP and ON are set at the L level. When the signals OP and ON are set at the L level, the output from the transmission driver to which the signals OP and ON are input is set at the H level, as shown in FIG. 2.

When the signal OUTENB is set at the L level, the transistors TA11 and TA14 are turned ON, whereby the nodes N1 and N2 are set at the H level and the L level, respectively. Therefore, the signals OP and ON are respectively set at the H level and the L level. This causes the output from the transmission driver to which the signals OP and ON are input to be set in a high impedance state, as shown in FIG. 2.

Figure 8A:
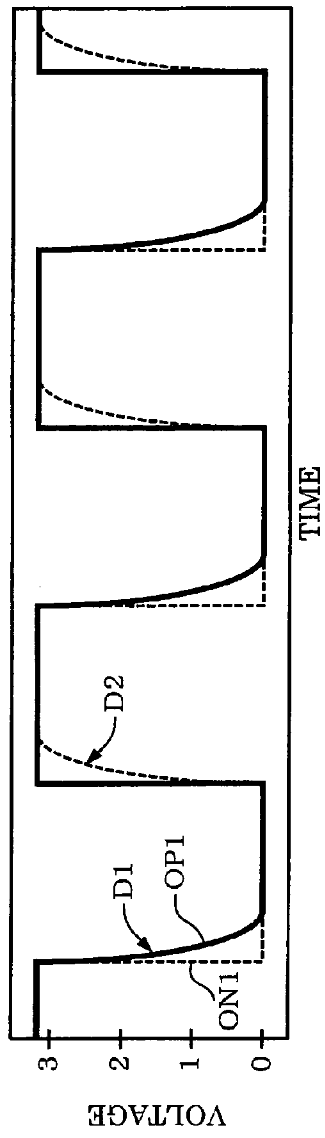
Figure 8B:
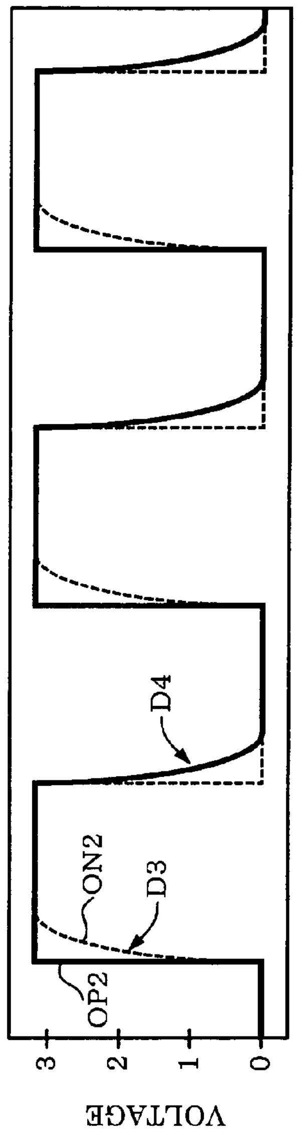
Figure 8C:
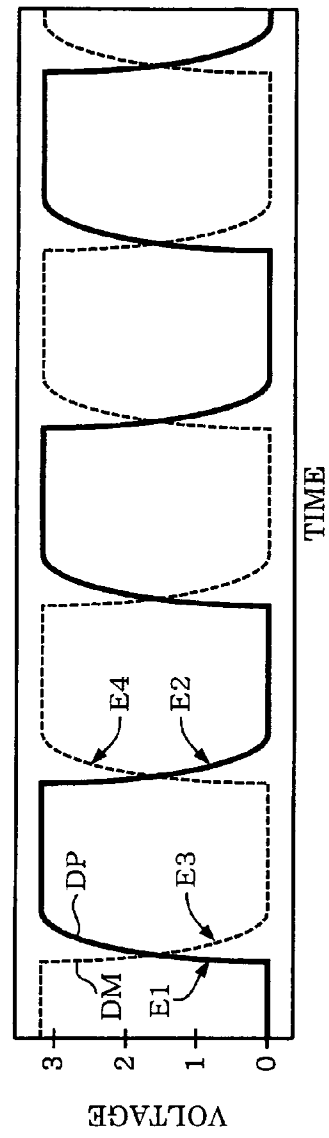

FIGS. 8A and 8B show waveform examples of the transmission control signals OP1, ON1, OP2, and ON2 input to the LS transmission drivers 71 and 72, and FIG. 8C shows a waveform example of the output signals DP and DM from the LS transmission drivers 71 and 72.

As shown in FIGS. 8A and 8B, the signals OP1 and OP2 have waveforms with a long fall time and a short rise time. This is realized by reducing the size (W/L and current supply capability) of the N-type transistor TA6 shown in FIG. 7A and increasing the size of the P-type transistor TA5. On the other hand, the signals ON1 and ON2 have waveforms with a long rise time and a short fall time. This is realized by reducing the size of the P-type transistor TA9 shown in FIG. 7A and increasing the size of the N-type transistor TA10.

The rise time of the signal DP can be increased, as indicated by E1 in FIG. 8C, by increasing the fall time of the signal OP1, as indicated by D1 in FIG. 8A. The fall time of the signal DP can be increased, as indicated by E2 in FIG. 8C, by increasing the rise time of the signal ON1, as indicated by D2 in FIG. 8A. Therefore, the rise time and the fall time of the signal DP can be increased.

The fall time of the signal DM can be increased, as indicated by E3 in FIG. 8C, by increasing the rise time of the signal ON2, as indicated by D3 in FIG. 8B. The rise time of the signal DM can be increased, as indicated by E4 in FIG. 8C, by increasing the fall time of the signal OP2, as indicated by D4 in FIG. 8B. Therefore, the rise time and the fall time of the signal DM can be increased.

According to this embodiment, the rise time and the fall time of the signals DP and DM can be increased by merely changing the size of the transistors TA5, TA6, TA9, TA10, and the like shown in FIG. 7A. Therefore, the rise time and the fall time of the signals DP and DM can be easily adjusted within the range of 75 to 300 ns with respect to the load capacitance within the range of 50 to 350 pf, whereby it is possible to follow the USB standard in the LS mode. Moreover, since the load capacitances of the output nodes QN1 and QN2 of the transmission drivers 71 and 72 do not change even if the size of the transistors TA5, TA6, TA9, and TA10 is changed, the HS mode data transfer using the transmitter circuit 54 can be prevented from being adversely affected.

In this embodiment, the LS transmission control circuit 60 outputs the signals OP1, ON1, OP2, and ON2 of which the rise time or the fall time is longer than the rise time or the fall time of the signals OP3, ON3, OP4, and ON4 output from the FS transmission control circuit 62, as shown in FIGS. 8A and 8B. This may be realized by reducing the size of the transistors TA6, TA9, and the like of the LS transmission control circuit 60 shown in FIG. 7A in comparison with the FS transmission control circuit 62.

5. HS Transmitter Circuit

Figure 9:
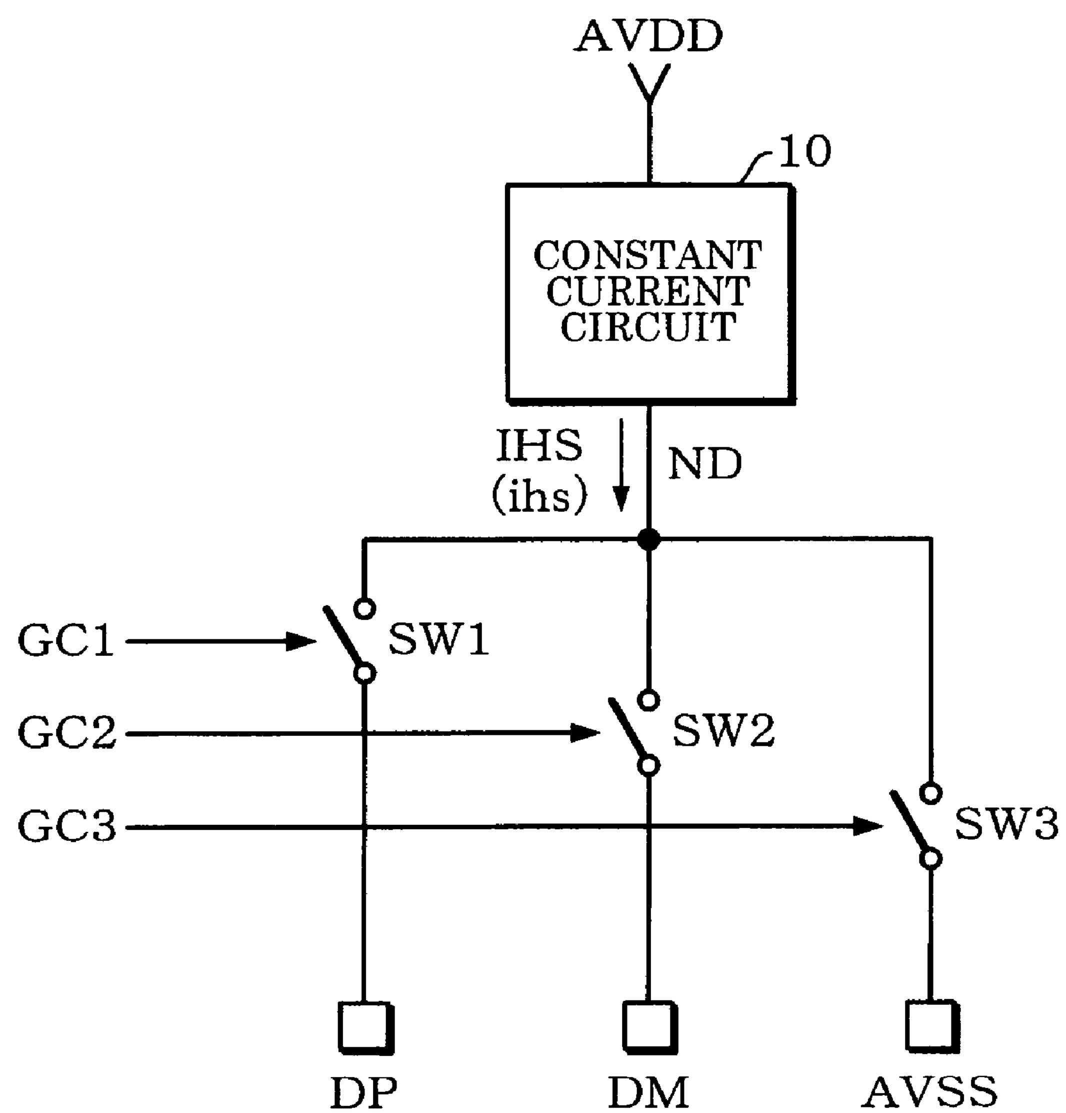
FIG. 9 shows a configuration example of an HS transmitter circuit.

FIG. 9 shows a configuration example of the HS transmitter circuit 54 (current driver) shown in FIG. 2. The transmitter circuit includes a constant current circuit 10 and first to third switch elements SW1, SW2, and SW3.

The constant current circuit 10 (current source or current circuit) is provided between the power supply AVDD and a node ND. The switch element SW1 is provided between the node ND and the positive-side signal line DP making up the differential signal lines. The switch element SW2 is provided between the node ND and the negative-side signal line DM making up the differential signal lines. The switch element SW3 is provided between the node ND and the power supply AVSS. The switch elements SW1, SW2, and SW3 may be formed using transistors (CMOS transistors or N-type transistors), and ON-OFF controlled using the transmission control signals GC1, GC2, and GC3.

The transmitter circuit shown in FIG. 9 drives (current-drives) the signal line DP or DM (first or second signal line in a broad sense) through the switch element SW1 or SW2 using current from the constant current circuit 10. In more detail, the switch elements SW1, SW2, and SW3 are ON-OFF controlled based on the transmission control signals GC1, GC2, and GC3 from the transmission control circuit 64 shown in FIG. 2, whereby the DP and DM signal lines are driven.

Figure 10A:
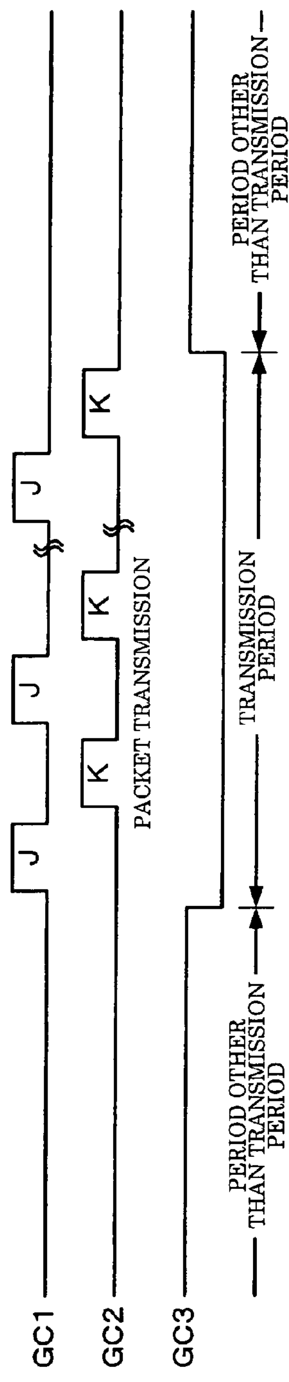
FIGS. 10A and 10B show signal waveform examples of HS transmission control signals.

FIG. 10A shows a signal waveform example of the transmission control signals GC1, GC2, and GC3. The signals GC1 and GC2 are non-overlapping signals, that is, one of the signals GC1 and GC2 is set to active (e.g. high level) when the other is set to inactive (e.g. low level). The signal GC3 is a signal which is set to inactive in a transmission period and is set to active in a period other than the transmission period.

The switch element SW1 is turned ON when the signal GC1 has been set to active, whereby current (constant current) from the constant current circuit 10 flows toward the DP signal line through the switch element SW1. On the other hand, the switch element SW2 is turned ON when the signal GC2 has been set to active, whereby current from the constant current circuit 10 flows toward the DM signal line through the switch element SW2. The terminating resistors are connected with the DP and DM signal lines. Therefore, when setting the signal GC1 to active and the signal GC2 to inactive, a J state is generated in which the voltage of the signal DP is 400 mV and the voltage of the signal DM is 0 V. When setting the signal GC1 to inactive and the signal GC2 to active, a K state is generated in which the voltage of the signal DP is 0 V and the voltage of the signal DM is 400 mV. A data transfer (packet transfer) through the USB bus can be performed by controlling the signals GC1 and GC2 to set the USB bus state in the J state or the K state.

As shown in FIG. 10A, the signal GC3 is set to active in a period other than the transmission (HS transmission) period, whereby current from the constant current circuit 10 flows toward the power supply AVSS through the switch element SW3. Specifically, current from the constant current circuit 10 is discarded. The potential of the node ND can be stabilized by causing current from the constant current circuit 10 to continuously flow toward the power supply AVSS (GND)

through the switch element SW3 even in a period other than the transmission period. This allows stable current from the constant current circuit 10 to flow toward the DP and DM signal lines through the switch elements SW1 and SW2 immediately after the start of transmission, whereby the response of the transmitter circuit can be increased.

The current value Ihs of current IHS from the constant current circuit 10 is as large as 17.78 mA. Therefore, when current from the constant current circuit 10 flows toward the power supply AVSS even in a period other than the transmission period, the power consumption of the transmitter circuit is increased.

Figure 10B:
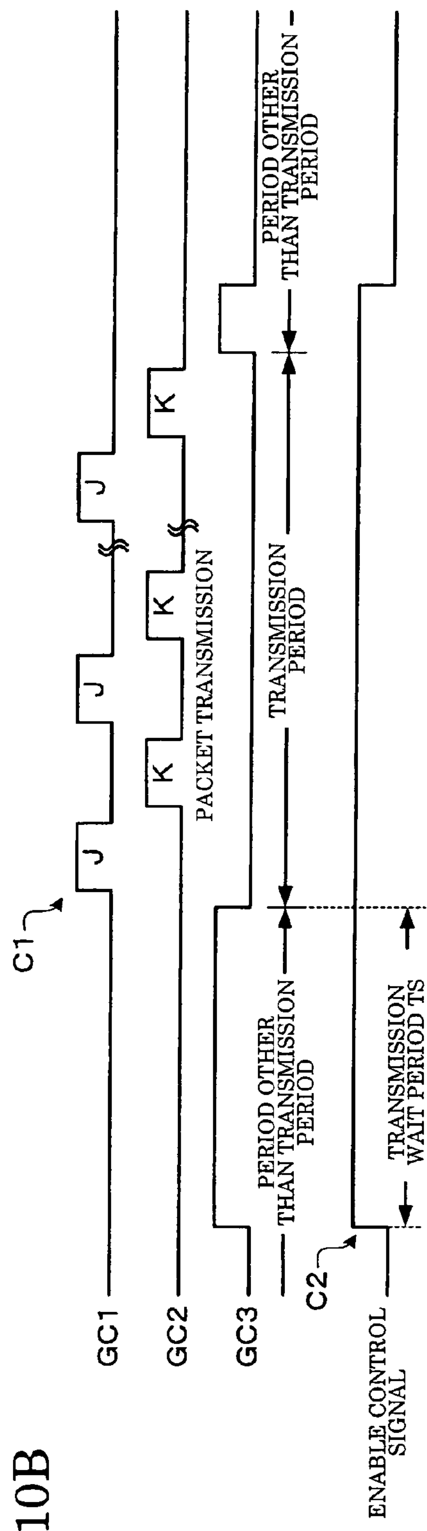

In FIG. 10B, an enable signal (signal which enables the current source) for the constant current circuit 10 is activated at a timing C2 preceding a transmission start timing C1 at which a packet is transmitted through the USB bus. Specifically, the enable signal is activated at a timing (C2) preceding the packet transmission start timing (C1) for a transmission wait period TS. This allows appropriate packet transmission using current from the constant current circuit 10 to be performed in the packet transmission period, and prevents a situation in which unnecessary current flows toward the power supply AVSS in a period other than the transmission period. Therefore, the power consumption of the data transfer control device and an electronic instrument can be reduced. Moreover, stable current from the constant current circuit 10 can be caused to flow toward the DP and DM signal lines through the switch elements SW1 and SW2 immediately after the start of transmission, by setting the transmission wait period TS at a length (e.g. 100 ns or more) sufficient for stabilizing current from the constant current circuit 10 and the potential of the node ND, whereby the high response performance of the transmitter circuit can be maintained.

In this case, it is preferable that the transaction layer (transaction controller) control (generate and output) the enable signal for the constant current circuit 10. As a comparative example, a method may be considered in which a packet layer (or lower layer) circuit such as a packet generation circuit control the enable signal. However, the packet layer circuit does not know transactions performed through the bus. Therefore, the method of the comparative example cannot realize intelligent control such as changing the signal change timing of the enable signal corresponding to the type of transaction executed.

On the other hand, the enable signal can be controlled corresponding to the transaction performed through the bus by causing the transaction layer circuit (transaction controller) which knows the transaction (transaction phase switch timing) to control the enable signal, whereby intelligent control can be realized such as changing the signal change timing of the enable signal corresponding to the type of transaction executed. In more detail, when the type of transaction is an IN transaction, the enable signal can be activated at a timing between the reception completion timing of an IN token packet and the transmission start timing of a data packet. When the type of transaction is an OUT transaction, the enable signal can be activated at a timing between the reception completion timing of a data packet and the transmission start timing of a handshake packet.

6. Control of Constant Current Value

Figure 11:
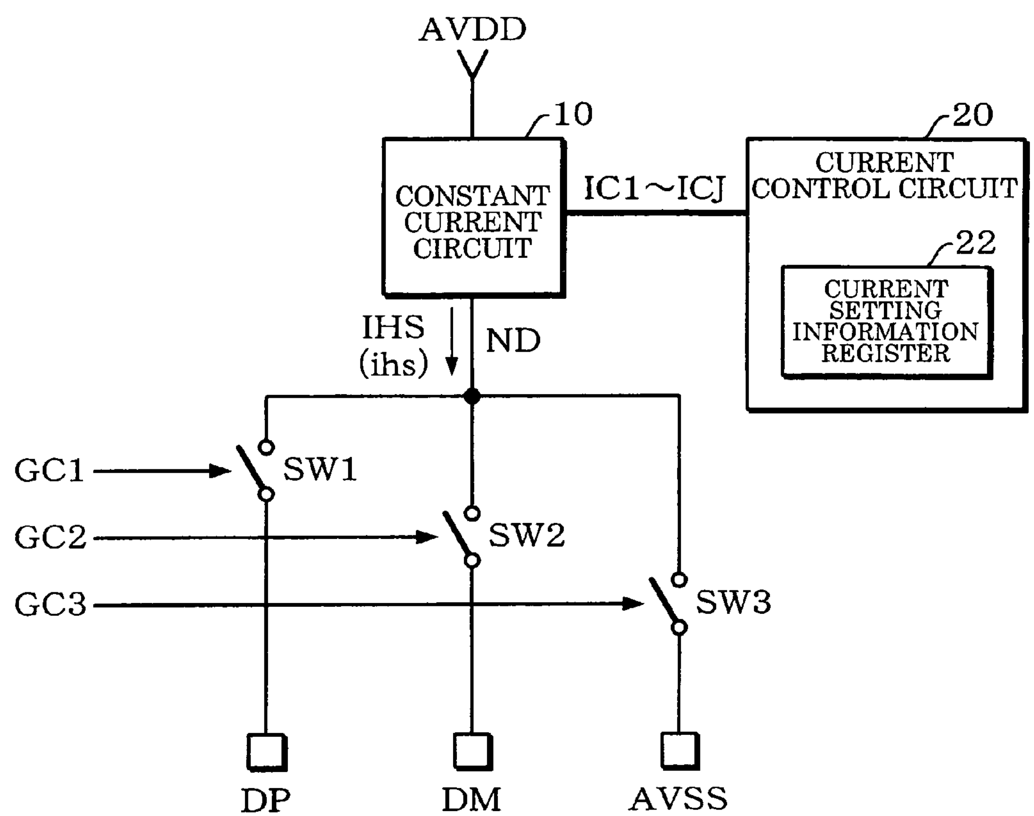
FIG. 11 shows a first modification of an HS transmitter circuit.

FIG. 11 shows a first modification of the HS transmitter circuit shown in FIG. 9. In FIG. 11, a current control circuit 20 is provided in addition to the configuration shown in FIG. 9. The current control circuit 20 is a circuit for variably controlling (setting) the value of current (current which flows between the power supply AVDD and the node ND) from the constant current circuit 10, and includes a current setting information register 22. In more detail, the current control circuit 20 outputs current control signals IC1 to ICJ to the constant current circuit 10. The voltage levels of the current control signals IC1 to ICJ are set based on setting information (setting value) set in the current setting information register 22. The setting information is written into the current setting information register 22 by firmware (processing section or CPU), for example. A constant current with a current value corresponding to the voltage levels of the current control signals IC1 to ICJ flows toward the node ND from the constant current circuit 10. For example, a constant current with a first current value flows when the voltage levels of the current control signals IC1 to ICJ are set at a first setting, a constant current with a second current value flows when the voltage levels of the current control signals IC1 to ICJ are set at a second setting, and a constant current with a Kth current value flows when the voltage levels of the current control signals IC1 to ICJ are set at a Kth setting.

An output high level voltage VHSOH is standardized in the USB standard. In more detail, the minimum value (vmin) of the voltage VHSOH is 360 mV, and the maximum value (vmax) of the voltage VHSOH is 440 mV. A terminating resistance rterm is standardized in the USB 2.0 standard. In more detail, the minimum value (rtl, rrl) of the terminating resistance rterm is 40.5 ohms, and the maximum value (rth, rrh) of the terminating resistance rterm is 49.5 ohms.

Figure 12:
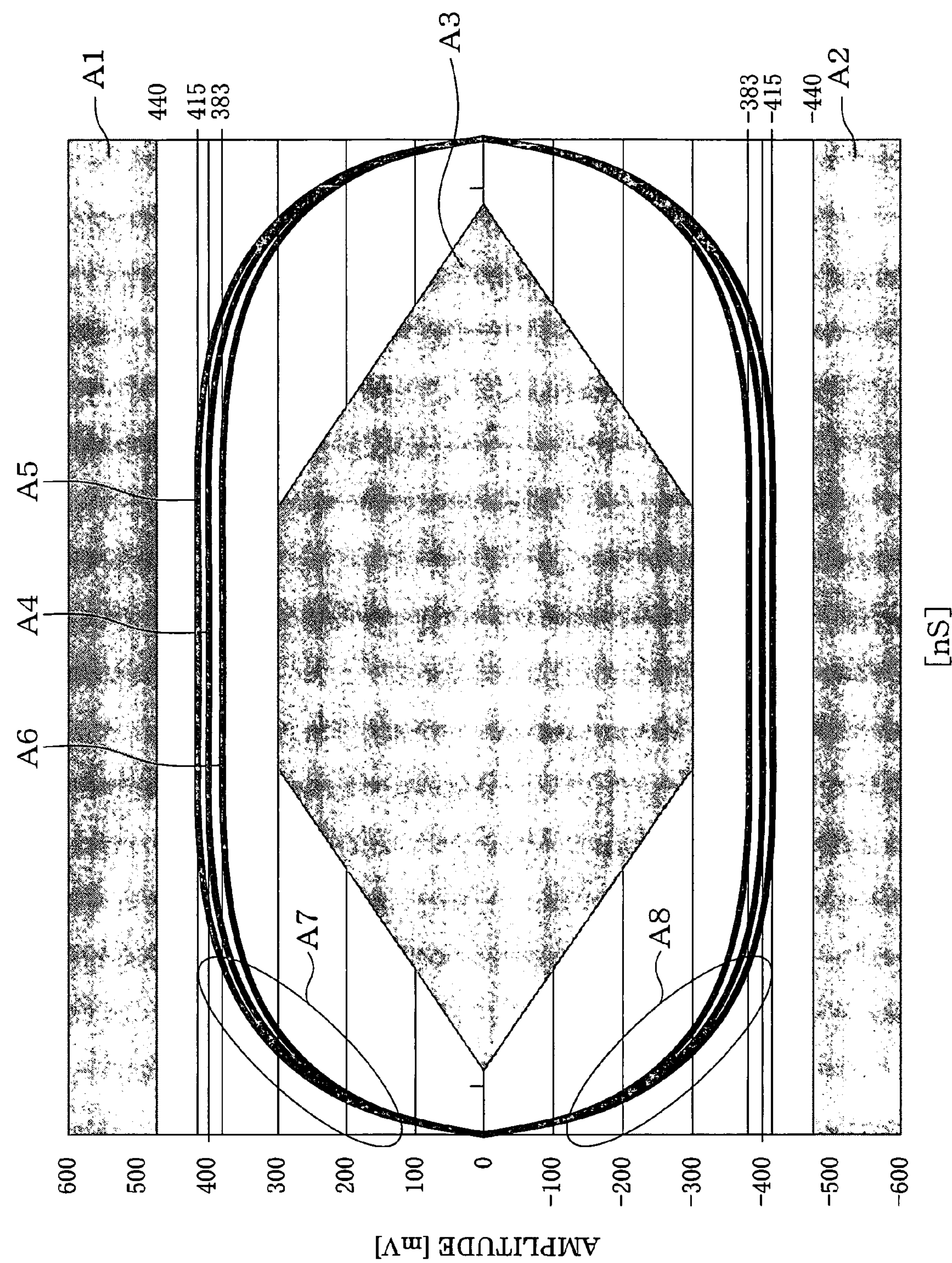
FIG. 12 is a view illustrative of an eye pattern.

FIG. 12 shows an example of the USB eye pattern (differential signal characteristics). The belt-like areas indicated by Al and A2 and the hexagonal area indicated by A3 in FIG. 12 are forbidden areas defined in the USB standard. It is necessary to design the transmitter circuit and the transmission path so that the DP and DM signal waveforms do not overlap the forbidden regions. As shown in FIG. 12, when the voltage levels of the DP and DM signal lines exceed 440 mV or become less than 360 mV, the DP and DM signal waveforms overlap the forbidden areas indicated by A1 and A2, whereby the USB standard cannot be satisfied.

In a known USB (USB 2.0) transmitter circuit, the value of current from the constant current circuit is fixed and is not variably controlled. Specifically, the constant current circuit supplies current with a fixed value of ihs=17.78 mA on the assumption that the transmitter-side and receiver-side terminating resistances are 45 ohms. In this case, since the voltage levels of the DP and DM signal lines are 400 mV, as indicated by A4 in FIG. 12, the DP and DM signal waveforms do not overlap the forbidden areas indicated by A1, A2, and A3.

On the other hand, the distance between an IC terminal of the data transfer control device including the transmitter circuit and a USB receptacle of a circuit board may be long. In this case, even if the voltage VHSOH is 400 mV at the IC terminal, the voltage VHSOH may not be 400 mV at the receptacle terminal. Moreover, a sufficient signal amplitude may not be obtained due to a change in device characteristics or waveform deterioration (waveform attenuation) on the transmission line. In addition, when the receiver-side data transfer control device does not conform to the USB standard, a data transfer may not be normally performed even if the transmitter-side signal waveform (VHSOH) conforms to the USB standard.

In FIG. 11, the current value Ihs of the current IHS from the constant current circuit 10 can be variably set. Specifically, the current value ihs is variably set based on the current control signals IC1 to ICJ from the current control circuit 20. Consider the case where the transmitter-side and receiver-side terminating resistances are 45 ohms, for example. In this case, VHSOH=vmin=360 mV when setting the current value ihs of current from the constant current circuit 10 at 16 mA, and VHSOH=vmax=440 mV when setting the current value ihs at 19.56 mA.

For example, when the signal amplitude attenuates to a large extent due to the long distance between the IC terminal of the data transfer control device and the USB receptacle of the circuit board, it is preferable to increase the output high level voltage VHSOH. In this case, the value ihs of current from the constant current circuit 10 is increased. This ensures that the waveform indicated by A5 in FIG. 12 is obtained as the DP and DM signal waveforms, whereby the voltage VHSOH at the USB receptacle terminal can be set at about 400 mV, even if the signal amplitude attenuates. Moreover, even if the forbidden area indicated by A3 in FIG. 12 is greater than that of the standard since the receiver-side data transfer control device does not conform to the USB standard, a data transfer without an error can be realized.

When the distance between the transmitter side and the receiver side is short such as when connecting a USB memory, the signal amplitude attenuates to only a small extent during transmission. In this case, the value ihs of current from the constant current circuit 10 is decreased in order to reduce power consumption. This allows the waveform indicated by A6 in FIG. 12 to be obtained as the DP and DM signal waveforms, that is, the voltage VHSOH becomes less than 400 mV. On the other hand, when the USB transmission path is short such as when connecting a USB memory, the receiver-side DP and DM signal waveforms rarely overlap the forbidden area indicated by A3, even if the voltage VHSOH is lower than 400 mV. The current consumption of the transmitter circuit can be reduced by reducing the current value ihs, whereby the power consumption of the data transfer control device including the transmitter circuit and an electronic instrument including the data transfer control device can be reduced.

In FIG. 11, the constant current circuit, which is usually designed to supply current with a fixed value, is designed to supply current with a variable value. As a method of a comparative example which variably sets the output high level voltage VHSOH, a method may be considered which variably controls only the resistances of the terminating resistors connected with the DP and DM signal lines, for example.

According to this method, when changing the transmitter-side terminating resistance, impedance matching between the transmitter-side terminating resistance and the receiver-side terminating resistance may not be achieved, whereby the transmission waveform may deteriorate.

In FIG. 11, since the current value of the constant current circuit 10 is variably controlled, the terminating resistance need not be changed. This facilitates impedance matching between the transmitter side and the receiver side, whereby an excellent transmission waveform can be maintained. In FIG. 11, the end user can adjust the current value ihs of the constant current circuit 10 using firmware or the like. This enables intelligent control such as setting a low power consumption mode by reducing the current value ihs when the transmission path is short, whereby a transmitter circuit differing from a known transmitter circuit can be realized.

The minimum value of the output high level voltage of the HS transmitter circuit is indicated by vmin (=360 mV), the maximum value of the output high level voltage of the transmitter circuit is indicated by vmax (=440 mV), the transmitter-side terminating resistance is indicated by rt, the receiver-side terminating resistance is indicated by rr, and the value of current from the constant current circuit 10 was is indicated by ihs. In this case, current from the constant current circuit 10 may be set in the range satisfying $\{(rt+rr)/(rt\times rr)\}\times vmin \leqq ihs \leqq \{(rt+rr)/(rt\times rr)\}\times vmax$, for example.

Therefore, the minimum value of the current value ihs is $ihsmin=\{(rt+rr)/(rt\times rr)\}\times vmin$, and the maximum value of the current value ihs is $ihsmax=\{(rt+rr)/(rt\times rr)\}\times vmax$. Therefore, the output high level voltage VSVOH when current with a value ihs=ihsmin flows is vmin=360 mV, and the output high level voltage VSVOH when current with a value ihs=ihsmax flows is vmax=440 mV. Accordingly, the value ihs of current from the constant current circuit 10 can be variably controlled in conformity with the USB standard. The minimum value of the receiver-side terminating resistance is indicated by rrl (=40.5 ohms), and the maximum value of the receiver-side terminating resistance is indicated by rrh (=49.5 ohms). In this case, current from the constant current circuit 10 may be set in the range satisfying $\{(rt+rrl)/(rt\times rrl)\}\times vmin<ihs<\{(rt+rrh)/(rt\times rrh)\}\times vmax$.

7. Variable Control of Terminating Resistance

Figure 13:
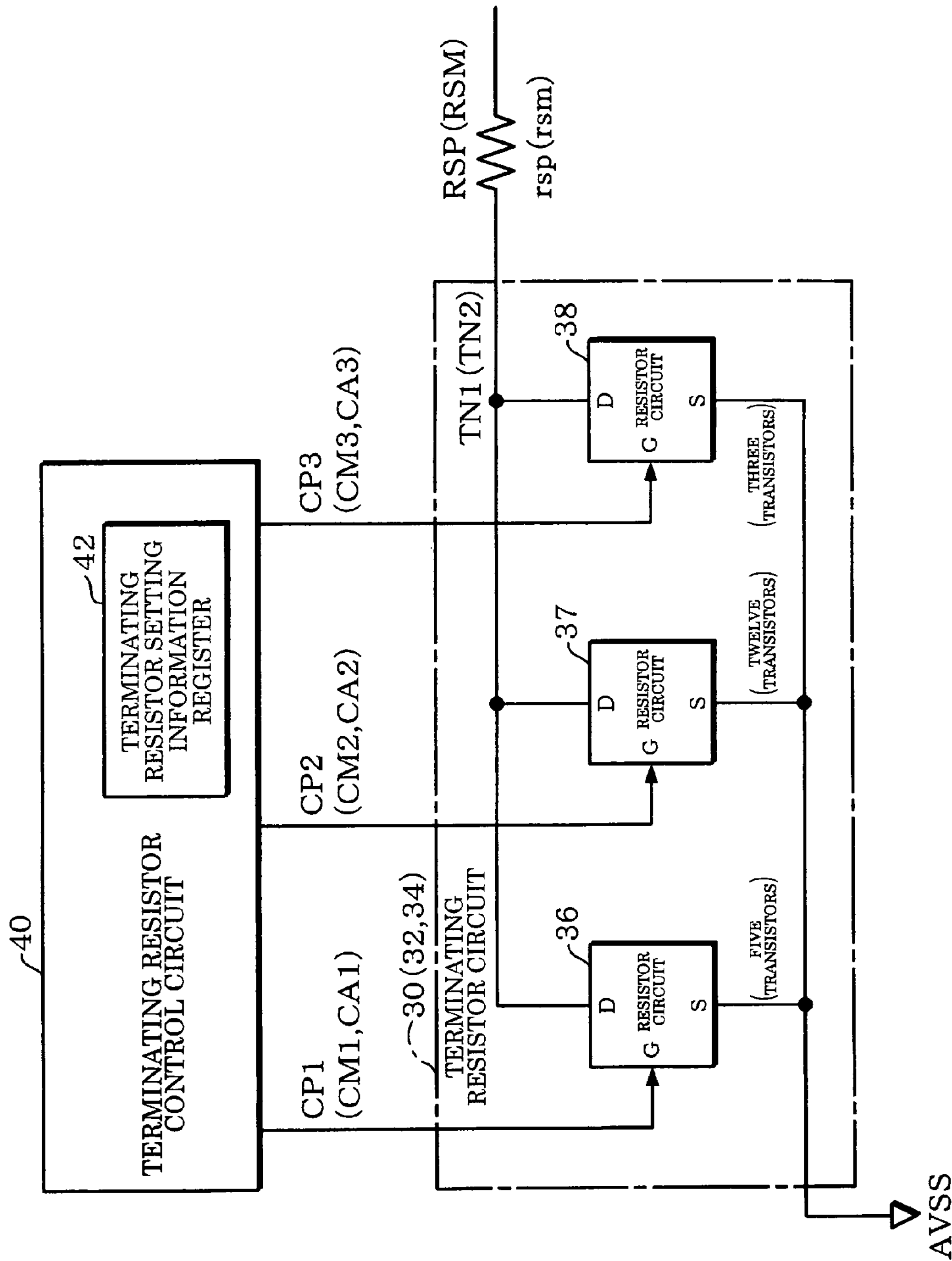
FIG. 13 shows a configuration example of a terminating resistor circuit.

FIG. 13 shows a configuration example of the terminating resistor circuit 30 shown in FIG. 3. The terminating resistor circuits 32 and 34 have a configuration similar to that shown in FIG. 13.

Figure 14A:
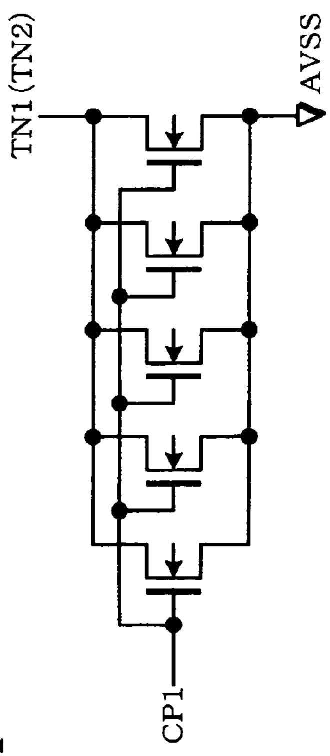
FIGS. 14A, 14B, and 14C show examples of N-type transistors forming a resistor circuit.
Figure 14B:
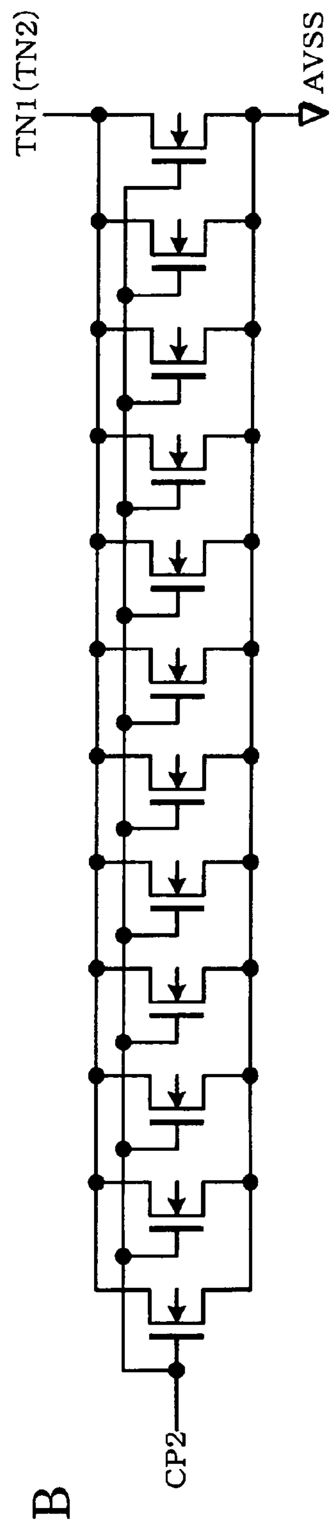
Figure 14C:
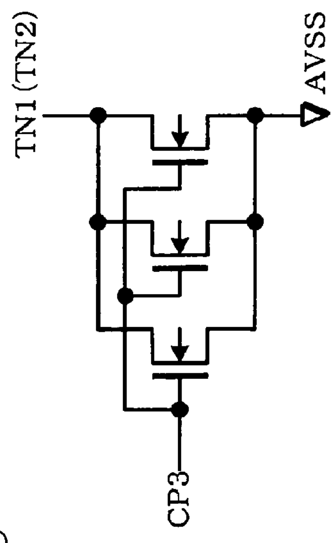

The terminating resistor circuit 30 includes resistor circuits 36, 37, and 38. Each of the resistor circuits 36, 37, and 38 includes a plurality of transistors. In more detail, as shown in FIGS. 14A, 14B, and 14C, the resistor circuits 36, 37, and 38 respectively include five parallel-connected N-type transistors, twelve parallel-connected N-type transistors, and three parallel-connected N-type transistors, for example. These N-type transistors are the transistors NTRTP and NTRTM formed in the N-type transistor areas ARN1 and ARN2 in FIGS. 5 and 6. The node TN1 is connected with the drains of the N-type transistors, and the power supply AVSS is connected with the sources of the N-type transistors. The resistor control signals CP1, CP2, and CP3 from the terminating resistor control circuit 40 are input to the gates of the N-type transistors forming the resistor circuits 36, 37, and 38, respectively. When the resistor control signals CP1, CP2, and CP3 are set to active, the N-type transistors forming the resistor circuits 36, 37, and 38 are turned ON. The resistances (terminating resistances) of the resistor circuits 36, 37, and 38 are determined by the ON resistances of the N-type transistors.

For example, when the resistor control signals CP1 to CP3 are set to active, the twenty (=5+12+3) parallel-connected transistors forming the resistor circuits 36, 37, and 38 are turned ON. The parallel resistance formed by the ON resistances of these transistors is 2.4 ohms, for example. Since the fixed resistance of the resistor RSP is rsp=39 ohms, the terminating resistance is 41.4 ohms.

When the resistor control signals CP1 and CP3 are set to active and the resistor control signal CP2 is set to inactive, the eight (=5+3) parallel-connected transistors forming the resistor circuits 36 and 38 are turned ON. The parallel resistance formed by the ON resistances of these transistors is 6.0 ohms, for example. Therefore, the terminating resistance is 39+6.0=45 ohms.

When the resistor control signal CP1 is set to active and the resistor control signals CP2 and CP3 are set to inactive, the five parallel-connected transistors forming the resistor circuit 36 are turned ON. The parallel resistance formed by the ON resistances of these transistors is 9.6 ohms, for example. Therefore, the terminating resistance is 39+9.6=48.6 ohms.

As described above, the terminating resistances of the DP and DM signal lines can be variably controlled in FIGS. 3 and 13. This allows the output high level voltage to be adjusted, as indicated by A4, A5, and A6 in FIG. 12. Moreover, an impedance matching can be achieved by changing the transmitter-side terminating resistance when an impedance matching between the transmitter-side terminating resistance and the receiver-side terminating resistance is not achieved.

8. Capacitance Adjustment Circuit

Figure 15:
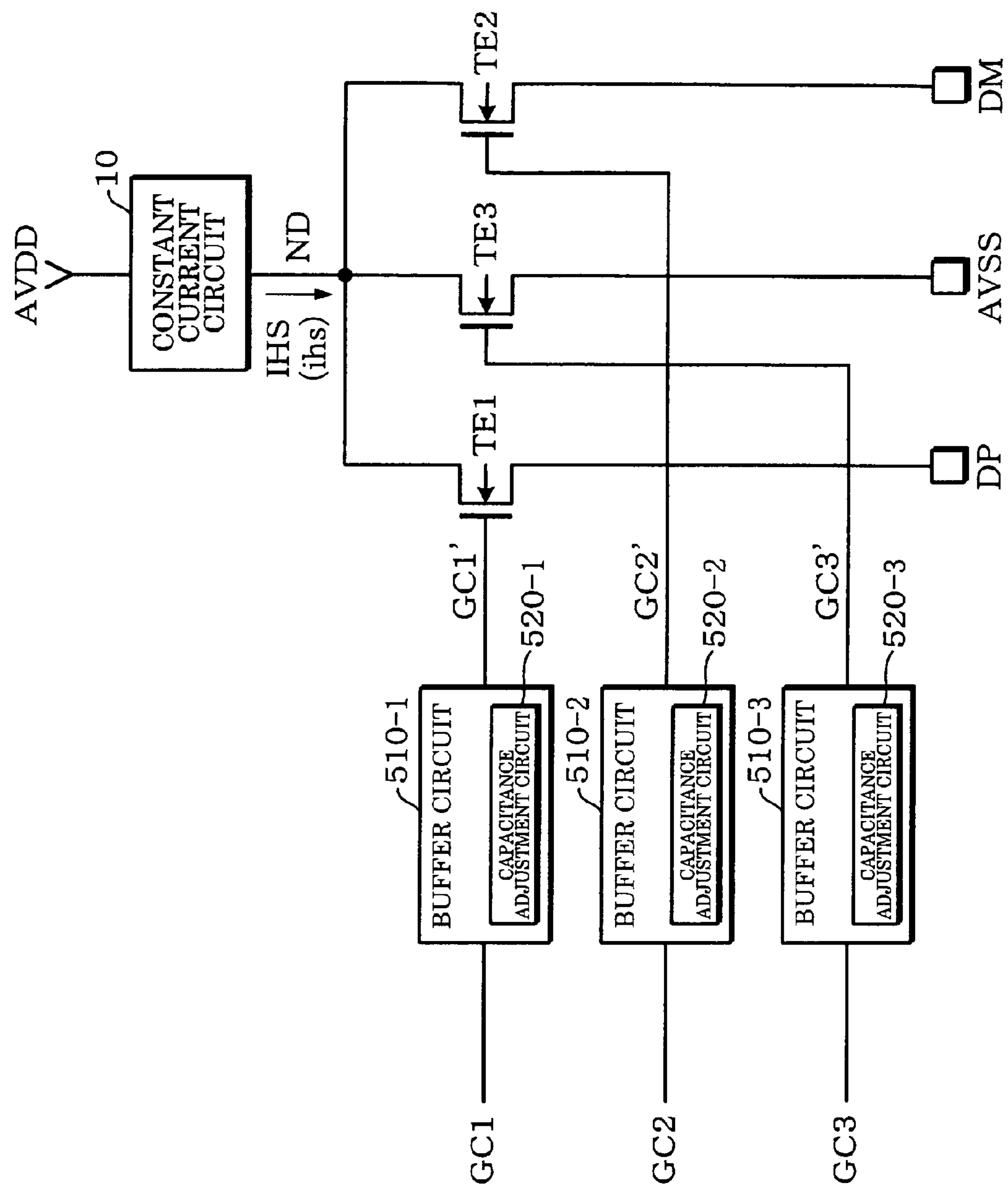
FIG. 15 shows a second modification of an HS transmitter circuit.

FIG. 15 shows a second modification of the HS transmitter circuit shown in FIG. 9. In FIG. 15, buffer circuits 510-1, 510-2, and 510-3 are additionally provided. In FIG. 15, the switch elements SW1, SW2, and SW3 shown in FIG. 9 are formed using transistors TE1, TE2, and TE3.

The buffer circuits 510-1, 510-2, and 510-3 receive the transmission control signals GC1, GC2, and GC3, and output transmission control signals GC1', GC2', and GC3' to the gates of the transistors TE1, TE2, and TE3, respectively. The transmission control signals GC1 and GC2 are non-overlapping signals, that is, one of the transmission control signals GC1 and GC2 is set to active when the other is set to inactive.

The buffer circuits 510-1, 510-2, and 510-3 respectively include capacitance adjustment circuits 520-1, 520-2, and 520-3. The output waveform of the HS transmitter circuit can be arbitrarily adjusted by providing the capacitance adjustment circuits 520-1, 520-2, and 520-3 to adjust the capacitance. Specifically, the eye pattern can be adjusted by adjusting the slew rate of the transmitter circuit. For example, the slew rate at the rising edge of the DP and DM signals can be adjusted, as indicated by A7 in FIG. 12, or the slew rate at the falling edge of the DP and DM signals can be adjusted, as indicated by A8 in FIG. 12. This allows selection of an optimum slew rate (potential gradient) corresponding to the transmission path or the substrate. Therefore, even if the partner-side data transfer control device (electronic instrument) connected through the USB bus does not completely conform to the USB standard, an accurate data transfer using the differential signals can be realized.

Figure 16:
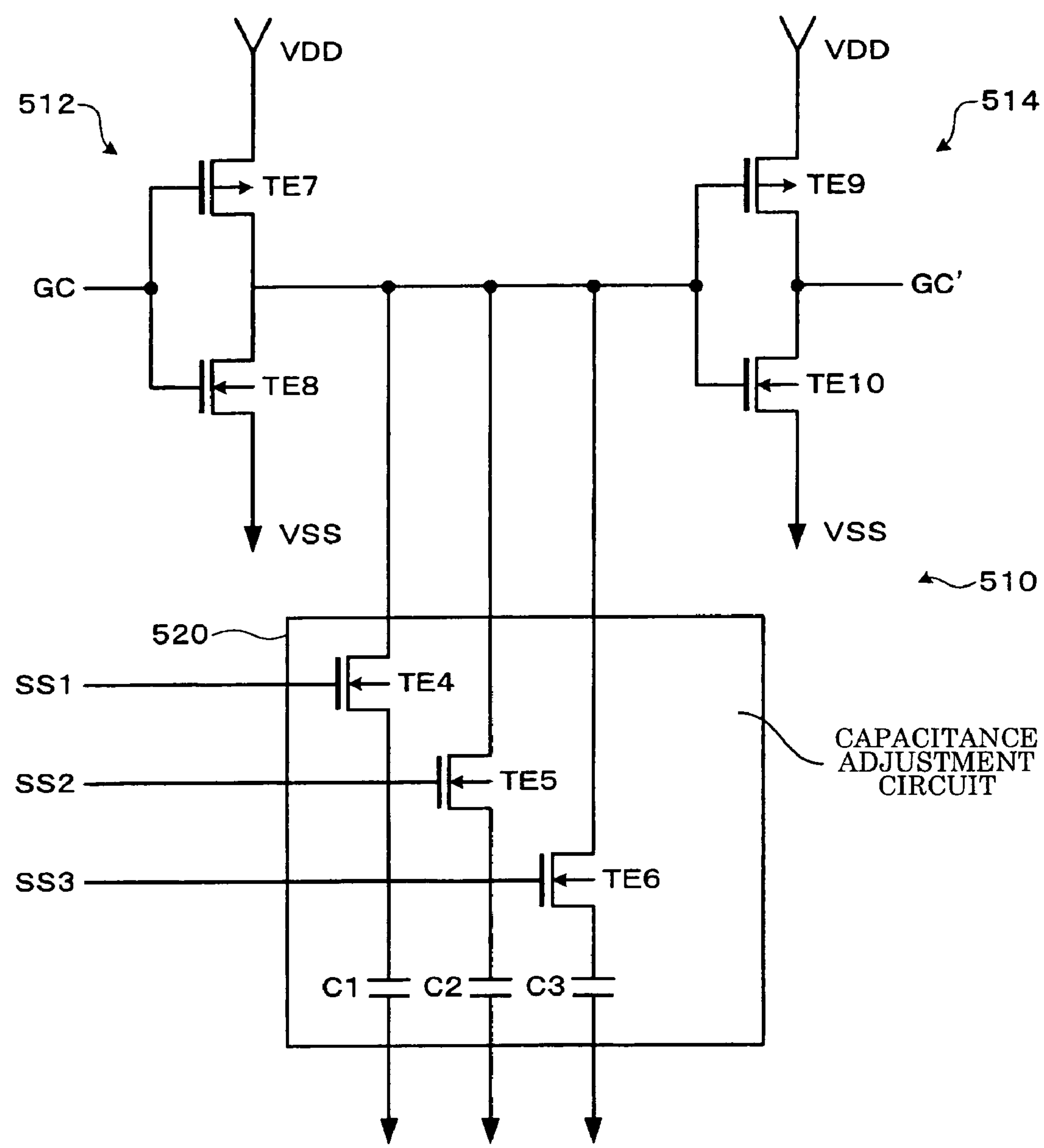
FIG. 16 shows a configuration example of a buffer circuit.

FIG. 16 shows a configuration example of the buffer circuit 510 (510-1, 510-2, 510-3) and the capacitance adjustment circuit 520 (520-1, 520-2, 520-3)). The buffer circuit 510 includes a first inverter 512 and a second inverter 514 of which the input node is connected with the output node of the inverter 512. The capacitance adjustment circuit 520 is connected with the output node of the inverter 512.

The capacitance adjustment circuit 520 includes transistors TE4, TE5, and TE6 (at least one capacitance adjustment switch element in a broad sense) which are ON-OFF controlled using capacitance adjustment signals SS1, SS2, and SS3, and capacitor elements C1, C2, and C3 (at least one capacitor element in a broad sense). One end of the capacitor elements C1, C2, and C3 is respectively connected with the other end (source) of the transistors TE4, TE5, and TE6 (capacitance adjustment switch elements), and the other end of the capacitor elements C1, C2, and C3 is connected with the power supply AVSS (second power supply).

The wiring capacitance of the output node of the inverter 512 (input node of the inverter 514) can be adjusted to an arbitrary value by variably setting the levels of the capacitance adjustment signals SS1, SS2, and SS3. This allows the slew rate of the output from the HS transmitter circuit to be arbitrarily adjusted. As the capacitor elements C1, C2, and C3, a gate capacitor of a MOS transistor or a capacitor formed between first and second polysilicon interconnects may be used.

According to the second modification shown in FIG. 15, not only the output high level voltage VHSOH, but also the slew rate can be adjusted. Therefore, the DP and DM signal waveforms can be variably set corresponding to the transmission path, whereby it is possible to easily conform to the USB standard relating to the eye pattern shown in FIG. 12.

9. Electronic Instrument

Figure 17:
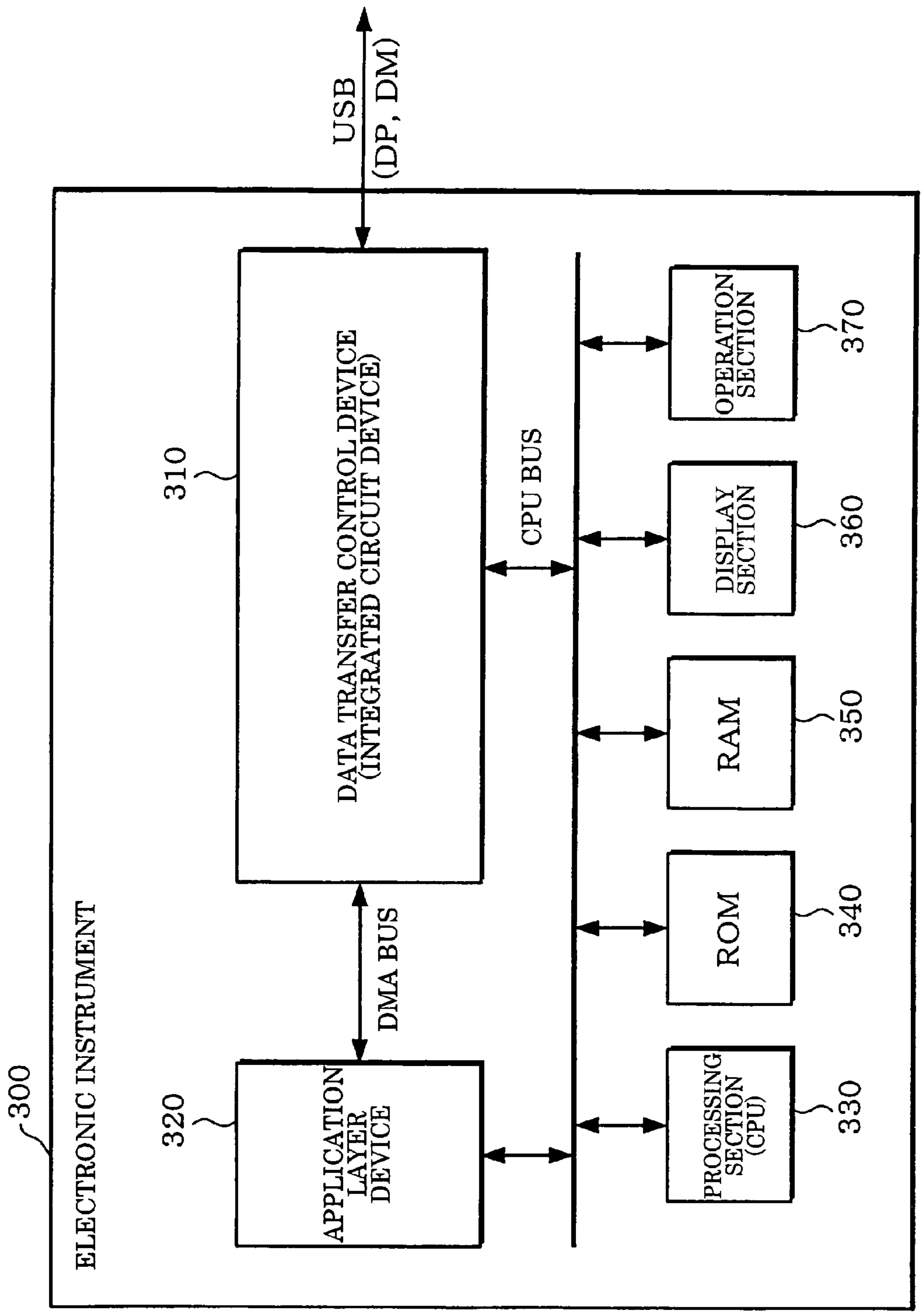
FIG. 17 shows a configuration example of an electronic instrument.

FIG. 17 shows a configuration example of an electronic instrument according to this embodiment. An electronic instrument 300 includes a data transfer control device 310 which is the integrated circuit device described in the above embodiment, an application layer device 320 formed of an ASIC or the like, a CPU 330, a ROM 340, a RAM 350, a display section 360, and an operation section 370. The electronic instrument 300 may have a configuration in which some of these functional blocks are omitted.

The application layer device 320 is a device which realizes an application engine of a portable telephone, a device which controls a drive of an information storage medium (hard disk or optical disk), a device which controls a printer, a device including an MPEG encoder and an MPEG decoder, or the like. The processing section 330 (CPU) controls the data transfer control device 310 and the entire electronic instrument. The ROM 340 stores a control program and various types of data. The RAM 350 functions as a work area and a data storage area for the processing section 330 and the data transfer control device 310. The display section 360 displays various types of information to the user. The operation section 370 allows the user to operate the electronic instrument.

In FIG. 17, a DMA bus and a CPU bus are separated. Note that these buses may be designed as one bus. A processing section which controls the data transfer control device 310 and a processing section which controls the electronic instrument may be separately provided.

As examples of the electronic instrument 300 according to this embodiment, a portable telephone, a portable music player, a portable image player, a video camera, a digital camera, an optical disk drive, a hard disk drive, an audio instrument, a portable game device, an electronic notebook, an electronic dictionary, a portable information terminal, and the like can be given.

Although only some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention. Any term (e.g. AVDD, AVSS, DP, or DM) cited with a different term (e.g. first power supply, second power supply, first signal line, or second signal line) having a broader meaning or the same meaning at least once in the specification and the drawings can be replaced by the different term in any place in the specification and the drawings. The configurations and the operations of the integrated circuit device, the data transfer control device, the transmitter circuit, and the electronic instrument are not limited to those described in the above embodiments. Various modifications and variations may be made. The above embodiments illustrate an example of applying the invention to the USB 2.0 standard. Note that the invention may also be applied to a standard based on the same idea as the USB 2.0 standard or a standard developed from the USB 2.0 standard.

What is claimed is:

1. An integrated circuit device comprising:

a first transmitter circuit which transmits data in a first transfer mode through a differential pair including a first signal line and a second signal line, and includes a first transmission driver which drives the first signal line and a second transmission driver which drives the second signal line; and a second transmitter circuit which transmits data through the differential pair in a second transfer mode which is higher in speed than the first transfer mode, and includes a third transmission driver which drives the first signal line and a fourth transmission driver which drives the second signal line;

a first P-type transistor area including a first P-type transistor of the first transmission driver and a third P-type transistor of the third transmission driver;

a first N-type transistor area including a first N-type transistor of the first transmission driver and a third N-type transistor of the third transmission driver;

a second P-type transistor area including a second P-type transistor of the second transmission driver and a fourth P-type transistor of the fourth transmission driver;

a second N-type transistor area including a second N-type transistor of the second transmission driver and a fourth N-type transistor of the fourth transmission driver;

the first P-type transistor area and the second P-type transistor area being disposed separately; and the first N-type transistor area and the second N-type transistor area being disposed separately.

2. The integrated circuit device as defined in claim 1, the first P-type transistor being provided between a first output node and a first power supply, the first output node being an output node of the first transmission driver, a first P-side transmission control signal being supplied to a gate of the first P-type transistor, the first N-type transistor being provided between the first output node and a second power supply, a first N-side transmission control signal being supplied to a gate of the first N-type transistor, the second P-type transistor being provided between a second output node and the first power supply, the second output node being an output node of the second transmission driver, a second P-side transmission control signal being supplied to a gate of the second P-type transistor, the second N-type transistor being provided between the second output node and the second power supply, a second N-side transmission control signal being supplied to a gate of the second N-type transistor, the third P-type transistor being provided between a third output node and the first power supply, the third output node being an output node of the third transmission driver, a third P-side transmission control signal being supplied to a gate of the third P-type transistor, the third N-type transistor being provided between the third output node and the second power supply, a third N-side transmission control signal being supplied to a gate of the third N-type transistor, the fourth P-type transistor being provided between a fourth output node and the first power supply, the fourth output node being an output node of the fourth transmission driver, a fourth P-side transmission control signal being supplied to a gate of the fourth P-type transistor, and the fourth N-type transistor being provided between the fourth output node and the second power supply, a fourth N-side transmission control signal being supplied to a gate of the fourth N-type transistor.

3. The integrated circuit device as defined in claim 2, comprising:

a first transmission control circuit for the first transfer mode which generates and outputs the first P-side transmission control signal, the first N-side transmission control signal, the second P-side transmission control signal and the second N-side transmission control signal; and a second transmission control circuit for the second transfer mode which generates and outputs the third P-side transmission control signal, the third N-side transmission control signal, the fourth P-side transmission control signal and the fourth N-side transmission control signal.

4. The integrated circuit device as defined in claim 3, the first transmission control circuit generating and outputting the first P-side transmission control signal, the first N-side transmission control signal, the second P-side transmission control signal and the second N-side transmission control signal of which rise time or fall time is greater than rise time or fall time of the third P-side transmission control signal and the third N-side transmission control signal, the fourth P-side transmission control signal and the fourth N-side transmission control signal output from the second transmission control circuit.

5. The integrated circuit device as defined in claim 3, at least one of rise time and fall time of the first and second P-side and N-side transmission control signals being greater than that of the third and fourth P-side and N-side transmission control signals.

6. An electronic instrument comprising:

the integrated circuit device as defined in claim 2; and a processing section which controls the integrated circuit device.

7. The integrated circuit device as defined in claim 1, the first P-type transistor area and the first N-type transistor area being adjacently formed; and the second P-type transistor area and the second N-type transistor area being adjacently formed.

8. An electronic instrument comprising:

the integrated circuit device as defined in claim 7; and a processing section which controls the integrated circuit device.

9. The integrated circuit device as defined in claim 7, the first P-type transistor area and the first N-type transistor area being adjacently formed in a plan view, and the second P-type transistor area and the second N-type transistor area being adjacently formed in the plan view.

10. The integrated circuit device as defined in claim 1, comprising:

a first damping resistor provided between a first node and the first signal line, the first node coupling with an output node of the first transmission driver and an output node of the third transmission driver; and a second damping resistor provided between a second node and the second signal line, the second node coupling with an output node of the second transmission driver and an output node of the fourth transmission driver;

the first damping resistor being formed in a first resistor area adjacent to the first N-type transistor area, and the second damping resistor being formed in a second resistor area adjacent to the second N-type transistor area.

11. The integrated circuit device as defined in claim 10, the first damping resistor being formed using a first N-type diffusion layer, and the second damping resistors being formed using a second N-type diffusion layer.

12. An electronic instrument comprising:

the integrated circuit device as defined in claim 10; and a processing section which controls the integrated circuit device.

13. The integrated circuit device as defined in claim 1, comprising:

a first terminating resistor circuit provided between a first node and a second power supply, the first node coupling with an output node of the first transmission driver and an output node of the third transmission driver; and a second terminating resistor circuit provided between a second node and the second power supply, the second node coupling with an output node of the second transmission driver and an output node of the fourth transmission driver;

a first N-type transistor forming the first terminating resistor circuit being formed in the first N-type transistor area, and a second N-type transistor forming the second terminating resistor circuit being formed in the second N-type transistor area.

14. The integrated circuit device as defined in claim 13, comprising:

a terminating resistor control circuit which variably controls terminating resistances of the first terminating register circuit and terminating resistances of the second terminating resistor circuits.

15. An electronic instrument comprising:

the integrated circuit device as defined in claim 13; and a processing section which controls the integrated circuit device.

16. An electronic instrument comprising:

the integrated circuit device as defined in claim 1; and a processing section which controls the integrated circuit device.

17. The integrated circuit device as defined in claim 1, the first P-type transistor area and the second P-type transistor area being disposed separately in a plan view, and the first N-type transistor area and the second N-type transistor area being disposed separately in the plan view.

18. An integrated circuit device comprising:

a first transmitter circuit which transmits data in a first transfer mode through a differential pair including a first signal line and a second signal line, and includes a first transmission driver which drives the first signal line and a second transmission driver which drives the second signal line;

a second transmitter circuit which transmits data through the differential pair in a second transfer mode which is higher in speed than the first transfer mode, and includes a third transmission driver which drives the first signal line and a fourth transmission driver which drives the second signal line; and a third transmitter circuit which transmits data through the differential pair in a third transfer mode higher in data transfer speed than the second transfer mode;

a first P-type transistor area including a first P-type transistor of the first transmission driver and a third P-type transistor of the third transmission driver;

a first N-type transistor area including a first N-type transistor of the first transmission driver and a third N-type transistor of the third transmission driver;

a second P-type transistor area including a second P-type transistor of the second transmission driver and a fourth P-type transistor of the fourth transmission driver; and a second N-type transistor area including a second N-type transistor of the second transmission driver and a fourth N-type transistor of the fourth transmission driver;

the third transmitter circuit including:

a constant current circuit provided between a first power supply and a node;

a first switch element provided between the node and the first signal line; and a second switch element provided between the node and the second signal line.

19. The integrated circuit device as defined in claim 18, the third transmitter circuit including a current control circuit which variably controls a value of current flowing from the constant current circuit, and the third transmitter circuit driving the first signal line through the first switch element or the second signal line through the second switch element using current from the constant current circuit variably controlled by the current control circuit.

20. The integrated circuit device as defined in claim 19, comprising:

a first buffer circuit which outputs a first transmission control signal to a gate of a first transistor forming the first switch element; and a second buffer circuit which outputs a second transmission control signal to a gate of a second transistor forming the second switch element;

one of the first transmission control signal and the second transmission control signal being set to inactive when the other of the first transmission control signal and the second transmission control signal is set to active, and each of the first buffer circuit and the second buffer circuit including:

a first inverter;

a second inverter of which an input node is electrically connected with an output node of the first inverter; and a capacitance adjustment circuit electrically connected with the output node of the first inverter.

21. The integrated circuit device as defined in claim 18, comprising:

a first buffer circuit which outputs a first transmission control signal to a gate of a first transistor forming the first switch element; and a second buffer circuit which outputs a second transmission control signal to a gate of a second transistor forming the second switch element;

one of the first transmission control signal and the second transmission control signal being set to inactive when the other of the first transmission control signal and the second transmission control signal is set to active, and each of the first buffer circuit and the second buffer circuit including:

a first inverter;

a second inverter of which an input node is electrically connected with an output node of the first inverter; and a capacitance adjustment circuit electrically connected with the output node of the first inverter.

22. The integrated circuit device as defined in claim 18, differential signals transmitted through the differential pair being signals according to a Universal Serial Bus (USB) standard, the first transfer mode being a low speed mode of the USB standard, the second transfer mode being a full speed mode of the USB standard, and the third transfer mode being a high speed mode of the USB standard.

23. An electronic instrument comprising:

the integrated circuit device as defined in claim 18; and a processing section which controls the integrated circuit device.

* * * * *